(12) United States Patent
Kvatinsky et al.

(10) Patent No.: US 11,611,352 B2
(45) Date of Patent: Mar. 21, 2023

(54) RECONFIGURABLE DAC IMPLEMENTED BY MEMRISTOR BASED NEURAL NETWORK

(71) Applicant: Technion Research & Development Foundation Limited, Haifa (IL)

(72) Inventors: Shahar Kvatinsky, Ramat-Gan (IL); Loai Danial, Nazareth (IL)

(73) Assignee: Technion Research & Development Foundation Limited, Haifa (IL)

( * ) Notice: Subject to any disclaimer, the term of this patent is extended or adjusted under 35 U.S.C. 154(b) by 336 days.

(21) Appl. No.: 16/629,607

(22) PCT Filed: Jul. 11, 2018

(86) PCT No.: PCT/IL2018/050759
§ 371 (c)(1),
(2) Date: Jan. 9, 2020

(87) PCT Pub. No.: WO2019/012533
PCT Pub. Date: Jan. 17, 2019

(65) Prior Publication Data
US 2021/0143834 A1 May 13, 2021

Related U.S. Application Data

(60) Provisional application No. 62/530,920, filed on Jul. 11, 2017.

(51) Int. Cl.
*H03M 1/66* (2006.01)
*H03M 1/80* (2006.01)

(52) U.S. Cl.
CPC .................. *H03M 1/808* (2013.01)

(58) Field of Classification Search
CPC ............ H03M 1/46; H03M 1/38; H03M 1/66; H03M 1/1038; H03M 1/361;
(Continued)

(56) References Cited

U.S. PATENT DOCUMENTS 5,043,913 A * 8/1991 Furutani ................ G06N 3/063
706/34
5,187,680 A * 2/1993 Engeler .................. G06N 3/063
708/801
(Continued)

FOREIGN PATENT DOCUMENTS

| CN | 105184365 | * 12/2015 |
| WO | WO 2016/195637 | 12/2016 |
| WO | WO 2019/012533 | 1/2019 |

OTHER PUBLICATIONS

Supplementary European Search Report and the European Search Opinion dated Mar. 18, 2021 From the European Patent Office Re. Application No. 18831221.9. (14 Pages).
(Continued)

*Primary Examiner* — Linh V Nguyen

(57) ABSTRACT

A digital to analog converter is constructed using a neural network layer. The converter has inputs for receiving parallel bits of a digital input signal and an output for outputting an analog signal which is based on the digital input. Connecting the input and the output is a neural network layer which is configured to convert the parallel bits into an output analog signal that is representative of the digital input signal. The neural network may be hardwired and the synapses may rely on memristors as programmable elements.

14 Claims, 11 Drawing Sheets

(58) Field of Classification Search
CPC .... H03M 1/1033; H03M 1/368; H03M 1/462;
H03M 1/468; H03M 1/80; H03M 1/808;
H03M 1/145; H03M 1/164; H03M 1/181;
H03M 1/26; H03M 1/44; H03M 3/04;
G11C 13/004; G11C 13/0069; G11C
16/08; G11C 13/003; G11C 2213/77;
G11C 13/0007; G11C 13/0028; G11C
2013/0073; G11C 16/26; G06N 20/00;
G06N 3/0635; G06N 3/063; G06N 3/08;
G06N 3/04; G06N 3/0454; G06N 3/084;
G06N 3/049; G06N 3/0481; G06N
3/0445; G06N 3/02; G06N 3/0675; G06N
3/06; G06N 20/20
USPC .................................. 341/144, 151, 153, 154
See application file for complete search history.

(56) References Cited

U.S. PATENT DOCUMENTS

| | | | | |
|---|---|---|---|---|
| 5,247,605 | A * | 9/1993 | Engeler | G06N 3/04 708/801 |
| 5,581,662 | A * | 12/1996 | Furuta | G06N 3/063 706/31 |
| 7,043,466 | B2 * | 5/2006 | Watanabe | G06N 3/063 706/26 |
| 8,954,363 | B2 | 2/2015 | Heliot et al. | |
| 9,646,243 | B1 * | 5/2017 | Gokmen | G06N 3/08 |
| 9,779,355 | B1 * | 10/2017 | Leobandung | G06N 3/084 |
| 9,818,057 | B2 * | 11/2017 | Nishitani | G06N 3/063 |
| 2003/0022626 | A1 * | 1/2003 | Miquel | H04B 7/15585 455/24 |
| 2015/0170025 | A1 * | 6/2015 | Wu | G06N 3/0635 706/25 |
| 2015/0269483 | A1 * | 9/2015 | Nishitani | G06N 3/063 706/25 |
| 2016/0364643 | A1 | 12/2016 | Cruz-Albrecht et al. | |
| 2019/0087356 | A1 * | 3/2019 | Fick | G06F 1/14 |
| 2019/0147330 | A1 * | 5/2019 | Otsuka | G11C 13/0069 706/29 |
| 2020/0082879 | A1 * | 3/2020 | Chen | G11C 7/10 |

OTHER PUBLICATIONS

Alibart et al. "High Precision Tuning of State for Memristive Devices by Adaptable Variation-Tolerant Algorithm", Nanotechnology, XP020217919, 23(7): 075201-1-075201-7, Jan. 20, 2012.
Gao et al. "Digital-to-Analog and Analog-to-Digital Conversion With Metal Oxide Memristors for Ultra-Low Power Computing", 2013 IEEE/ACM International Symposoium on Nanoscale Architectures, Nanoarch, XP032498586, Brooklyn, NY, USA, Jul. 15-17, 2013, p. 19-22, Jul. 15, 2013.
Jahromi et al. "Memristor Based Digital-to-Analog Convertor and Its Programming", 2015 23rd Iranian Conference on Electrical Engineering, ICEE, XP055345752, Tehran, Iran, May 10-14, 2015, p. 1352-1356, May 10, 2015.
Wikipedia "Gradient Descent", Wikipedia, XP055733854, p. 1-8, Nov. 4, 2014, Last Edited Sep. 8, 2020.
International Preliminary Report on Patentability dated Jan. 23, 2020 From the International Bureau of WIPO Re. Application No. PCT/IL2018/050759. (8 Pages).
International Search Report and the Written Opinion dated Nov. 15, 2018 From the International Searching Authority Re. Application No. PCT/IL2018/050759. (13 Pages).
Chua et al. "Memristor—The Missing Circuit Element", IEEE Transactions on Circuit Theory, CT-18(5): 507-519, Sep. 1971.
Communication Pursuant to Article 94(3) EPC dated Sep. 22, 2022 From the European Patent Office Re. Application No. 18831221.9. (13 pages).
Soudry et al. Memristor-Based Multilayer Neural Networks With Online Gradient Descent Training, IEEE Transactions on Neural Netyworks and Learning Systems, 26(10): 2408-2421, Oct. 2015.

* cited by examiner

Fig. 1 – Prior Art

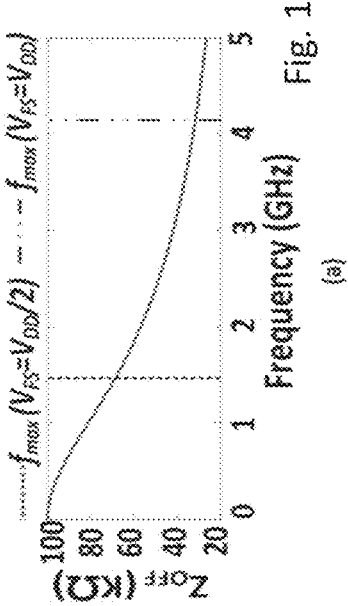
Fig. 9A
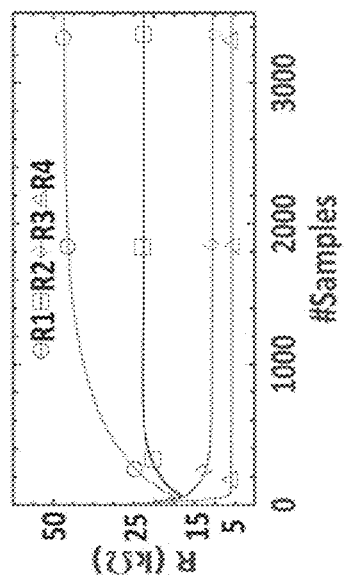
Fig. 9B
Fig. 9C
Fig. 9D
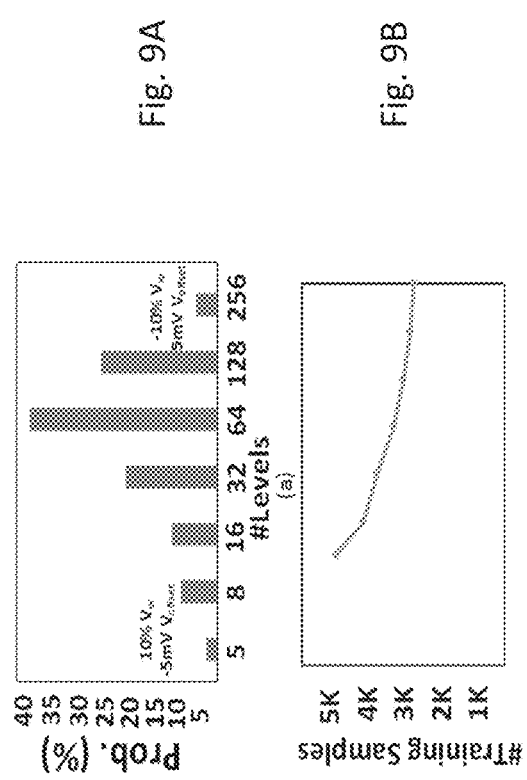
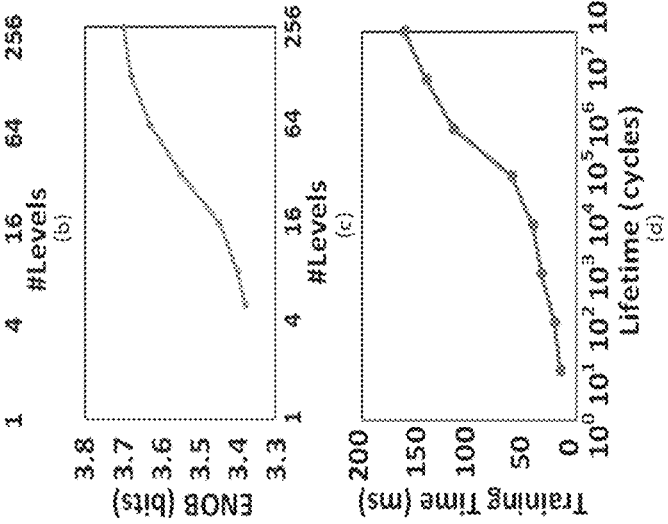
Fig. 10A
Fig. 10B

RECONFIGURABLE DAC IMPLEMENTED BY MEMRISTOR BASED NEURAL NETWORK

RELATED APPLICATIONS

This application is a National Phase of PCT Patent Application No. PCT/IL2018/050759 having International filing date of Jul. 11, 2018, which claims the benefit of priority under 35 USC § 119(e) of U.S. Provisional Patent Application No. 62/530,920 filed on Jul. 11, 2017. The contents of the above applications are all incorporated by reference as if fully set forth herein in their entirety.

FIELD AND BACKGROUND OF THE INVENTION

The present invention, in some embodiments thereof, relates to a reconfigurable digital to analog converter (DAC).

The digital to analog converter (DAC) is a ubiquitous component in data-driven acquisition systems and mixed-signal circuitry. Easily processed digital information in digital systems, is routinely converted to real-world analog signals such as temperature, pressure, sound, and images. In modern VLSI circuit design, power consumption awareness and reliable computation constraints have rigorously paved the way to hybrid analog-digital design methodologies. A key role of an efficient hybrid framework is a fast, robust and ultra-low-energy DAC. However, achieving both high resolution and speed is challenging due to the effect of timing errors, jitters and parasitic capacitance.

Furthermore, the real limiter of such accurate data converters is device mismatches, which are due to manufacturing process variations over advanced continuous scaling. These imperfections are poorly handled by techniques in ways that have tremendous overhead. Therefore, the trade-off between performance and reliability is considered as a major bottleneck within data converter design, and requiring special purpose design and sophisticated techniques for specific applications.

A. Binary-Weighted DAC

Conceptually, the simplest type of DAC uses a binary weighted style architecture, where N (number of bits) binary-weighted distributed elements (current sources, resistors, or capacitors) are combined to provide a discrete analog output with finite resolution. Binary-weighted DAC is based on a very simple and intuitive concept, and utilizes the fundamental rule-of-thumb binary to decimal basis transformation. The direct conversion feature may be suitable for high-speed applications using a minimal number of conventional components with small die area. Such a device employs the characteristics of the inverting summer operational amplifier circuit and negative feedback resistor (KCL and virtual ground). In this type of DAC, the output voltage is the inverted sum of all the input voltages as illustrated in FIG. 1, which shows a conventional binary weighted resistor-based DAC.

Digital inputs follow full-scale voltages, this means that '1' is equivalent to Vdd, and similarly '0' is equivalent to 0 V. The LSB input is connected to the highest resistance value, which resistance is equal to the feedback resistance R. Accordingly, the MSB input is connected to the lowest resistance value $R/2^{N-1}$, and the intermediate bits are determined according to the corresponding binary-weights as appropriate. The resulting discrete voltage of the amplifier output is given by:

$$Vout = \frac{-1}{2^N - 1} * \sum_{i=0}^{N-1} 2^i . V_i \quad (1)$$

where the minus sign is a result of the inverting operational amplifier, and $V_i$ is the digital voltage input of a bit with index i, after it has been attenuated by $(2^N-1)$, which is a normalization factor that fits the full-scale voltage. The output voltage is proportional to the binary value of the word $V_{N-1} \ldots V_0$.

Despite the fact that the binary-weighted DAC concept and implementation are very simple, it suffers from critical practical shortcomings. The spread components which define the ratio between the MSB and LSB coefficients (dynamic range) are very large and grow exponentially with the number of resolution bits. Thus, accurate matching becomes difficult, and a huge asymmetric area is overwhelmed with power starved resistors, e.g., for N bits the number of resistors may equal $2^{N-1}$. Furthermore, the maintenance of accurate resistances over a wide range of values is problematic. In advanced submicron CMOS fabrication technologies, it is challenging to manufacture resistors over a wide resistance range that preserve an accurate ratio especially in the presence of temperature variations. Furthermore, process imperfections degrade the conversion precision and increase the vulnerability to mismatch errors.

In conclusion, practical limitations and scalability drawbacks are pushing this type of DAC out of the applications' band of interest, meaning out of both high-speed and high precision applications. Tremendous efforts have been invested to develop new techniques to eliminate such mismatch errors, such as self-calibration and current steering. Furthermore, alternative architectures have been observed e.g., fully/partially segmented DACs, to achieve better accuracy and robustness.

B. Memristors

The memristor was originally proposed as the missing fourth fundamental passive circuit element. Memristors are two-terminal analog passive devices with varying resistance, where their resistance changes according to the time integral of the current through the device, or alternatively, the integrated voltage upon the device. Memristors are non-volatile by definition, and today, most resistive non-volatile memory technologies can be considered as memristors, and are usually fabricated in a BEOL CMOS process.

Furthermore, the memristor's relatively small size enables the integration of memory with computing elements and allows a compact, dense and efficient parallel architecture for machine learning algorithms and artificial neural networks. Thus, it is very attractive to integrate memristors as weighted elements in binary-weighted DAC to achieve high energy-efficiency and scalability, thanks to its activation-dependent dynamics, which renders it promising for registering and updating of synaptic weights. In previous work of the present inventors it was suggested to use the following "small signal" analysis model of memristor which would describe the gradual adaptation process of synaptic weights $$(t)=((t))(t) \quad (2)$$

$$\dot{s}(t)=v(t) \quad (3)$$

where s is a general state variable that evolves according to voltage—equation (3), and equation (2) is Ohm's law with variable conductance.

Thus, the memristor enables an efficient implementation of trainable neural networks in hardware. To accurately model the memristive non-linear behaviors in the present embodiments design and evaluation, the VTEAM model based on the above is used herein.

C. Online Gradient Descent Learning Algorithm

The field of machine learning (ML) is dedicated to the construction and study of systems that can be learned from data, which evolve a cognitive ability to make crucial decisions intelligently based on a training phase. Artificial Neural Networks (ANNs) and neuromorphic computing are well-established infrastructures that apply brain-inspired learning rules to interpolate novel computational abilities beyond the conventional paradigm, e.g., adaptation and self-repair. In previous work of the present inventors, a simple neural network topology (perceptron), composed from a single layer of binary inputs, synapses Wi (decimal weights) and a single neuron was analyzed. The neuron is considered as the de-facto element of neuro-processing and performs the following dot product of inputs and weights $$A = \Sigma_{i=0}^{N-1} W_i V_i \quad (4)$$

where A is an analog result of the weighted sum of the digital inputs.

SUMMARY OF THE INVENTION

An equivalence between the above equations (1) and (4) above may be derived. Thus, equation (1) of the binary-weighted DAC could be seen as a special case of single-layer NN, and equation (4) could be adjusted using ANNs learning methods to behave as a binary-weighted DAC.

The present embodiments may thus provide a digital to analog converter made from at least one neural network layer. The layer may be hardwired and may use a memristor as the programmable element to allow the network to learn, and a feedback-based learning process is provided.

According to an aspect of some embodiments of the present invention there is provided a digital to analog converter comprising:

inputs for receiving parallel bits of a digital input signal;
an output for outputting an analog signal; and
a neural network layer connecting the inputs with the output and configured to convert the parallel bits into an output analog signal representative of the digital input signal.

In an embodiment, the network comprises a plurality of adaptable synapses, each associated with a respective one of the inputs; and the output is connected to each of the plurality of adaptable synapses to receive a combined synapse signal from which to provide the output analog signal.

In an embodiment, each synapse is set with a respective weight and the output analog signal is a weighted sum of the parallel bits of the digital input signal.

In an embodiment, each of the adaptable synapses comprises a memristor, the memristor being set with the respective weight.

In an embodiment, the synapses have respective enablement inputs and the respective weightings are configurable via feedback upon enabling via the enablement inputs at each respective memristor.

In an embodiment, the adjustable weightings are configurable via the feedback to minimize an error measured in the discrete analog output.

In an embodiment, the error minimization is carried out using successive iterations of a stochastic gradient descent.

In an embodiment, the stochastic gradient descent comprises iterations of $$\Delta W_i^{(k)} = -\eta \frac{\partial E}{\partial W_i^{(k)}} = -\eta \frac{\partial E}{\partial A^k} \cdot \frac{\partial A^{(k)}}{\partial W_i} = -\eta (A^{(k)} - t^{(k)}) V_i^{(k)}$$

in which $W_i^{(k)}$ are the respective weights for the $k^{th}$ sample, $\eta$ is a learning rate and $V_i^{(k)}$ is a single empirical sample provided to the input at the $k^{th}$ iteration.

In an embodiment, the synapses respectively comprise a memristor connected to a common terminal of two MOSFET transistors of complementary type respectively, a synapse output being the current flowing through the memristor.

In an embodiment, the two MOSFET transistors have respective gates and the enablement input comprises a connection to the respective gates.

In embodiments, the error minimization is carried out using successive iterations of a binary weighted time-varying gradient descent learning rule.

The rule may thus be:

$$\Delta W_i^{(k)} = -\eta(t)(A^{(k)} - t^{(k)}) V_i^{(k)}$$

wherein $\eta(t) =$ $\eta$ if $k <= K/2$ $\eta/2$ if $K/2 < k <= 3K/4$

...

$\eta/2^{N-1}$ if $(2^{N-1} - 1).K/2^{N-1} < k <= (2^N - 1).K/2^N$ $W_i^{(k)}$ are the respective weights for the $k^{th}$ sample, and $Vi^{(k)}$ is a single empirical sample provided to the input at the $k^{th}$ iteration.

According to a second aspect of the present invention there is provided a method for carrying out digital to analog conversion comprising:

receiving parallel bits of a digital input signal;
using a neural network layer to pass the parallel bits via respectively weighted synapses to an output, thereby to form an output analog signal representative of the digital input signal at the output; and
outputting the output analog signal.

The method may comprise setting the respective weights at individual synapses.

In embodiments, each of the adaptable synapses comprises a memristor, the method comprising setting the memristors with the respective weight.

In embodiments, the synapses have respective enablement inputs, the method comprising enabling the enablement inputs and writing in the respective weightings using feedback from an error measured in the output.

The synapses may respectively comprise a memristor connected to a common terminal of two MOSFET transistors of complementary type respectively, and the method may in such a case comprise using current flowing through the memristor as the synapse output.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWING(S)

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

Figure 4:
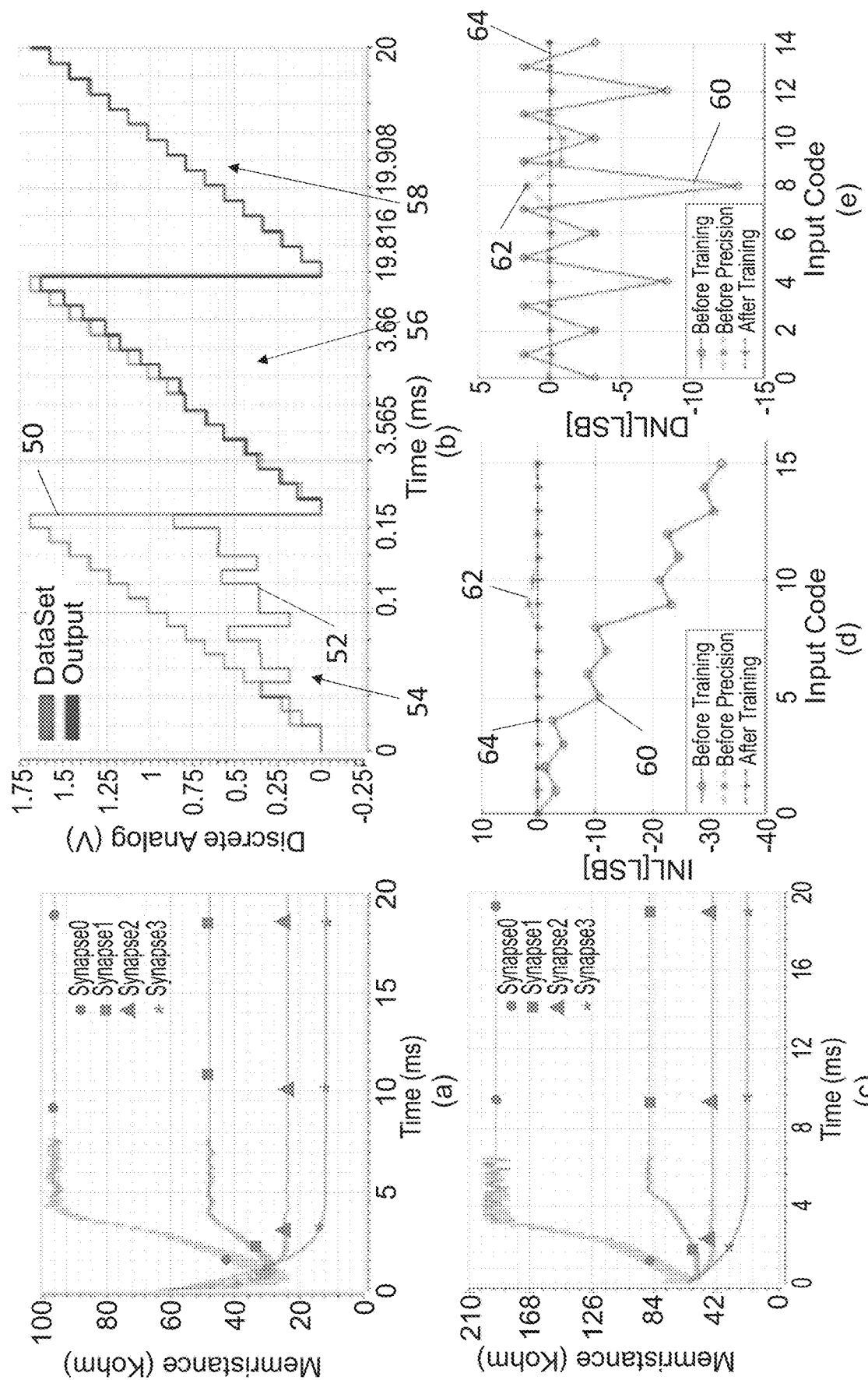
Figure 6:
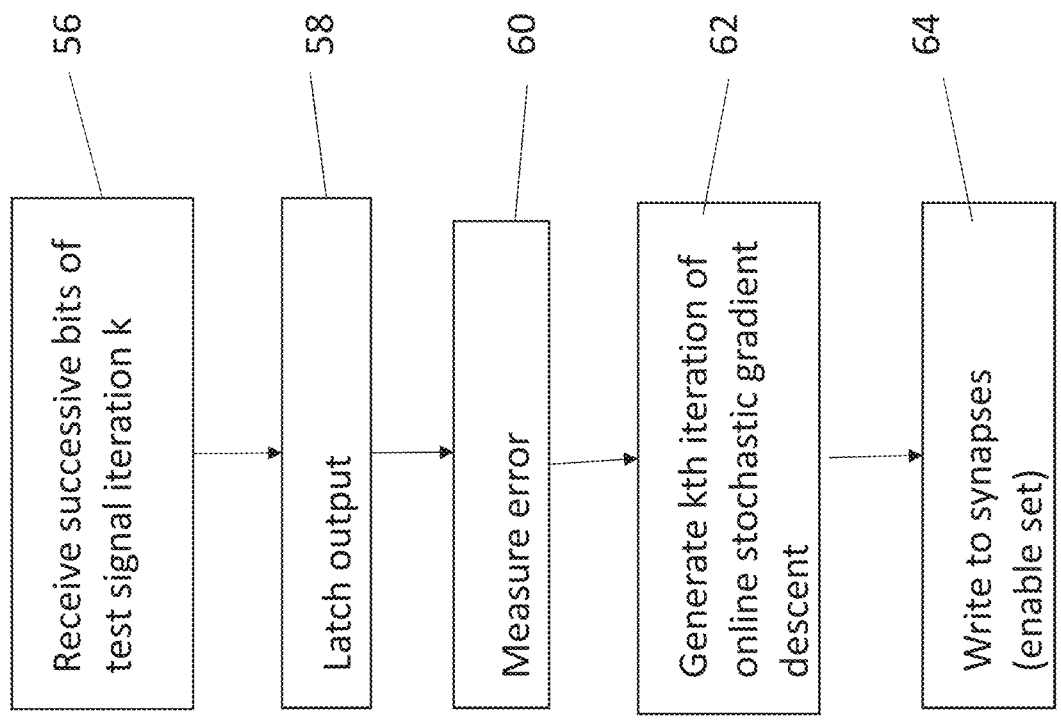
Figure 5:
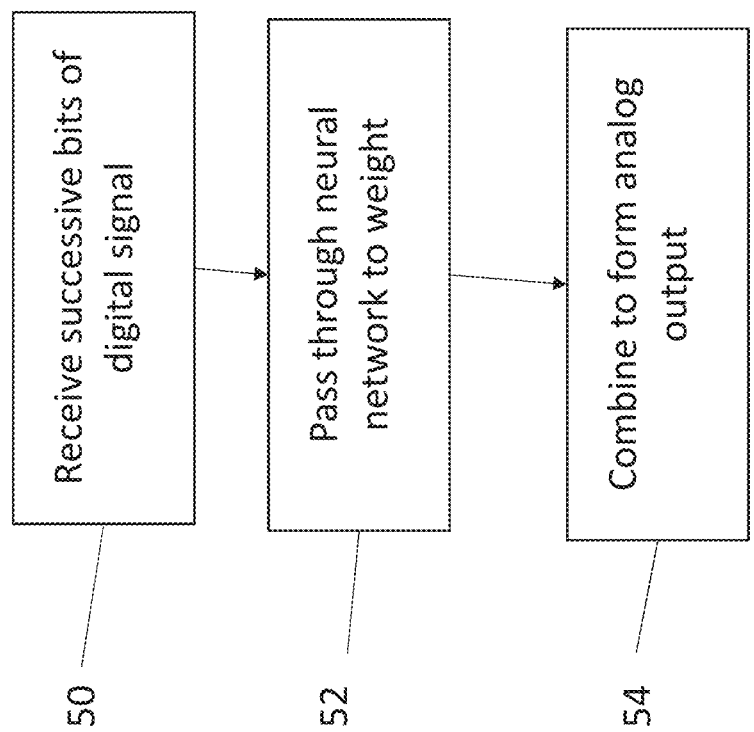

FIGS. 4(*a*) to 4(*e*) are graphs showing exemplary evaluations of the present embodiments;

FIG. 5 is a simplified schematic flow chart showing digital to analog conversion using embodiments of the present invention; and FIG. 6 is a simplified diagram showing an iteration of the learning process for updating the weightings at the synapses according to an embodiment of the present invention.

Figure 7B:
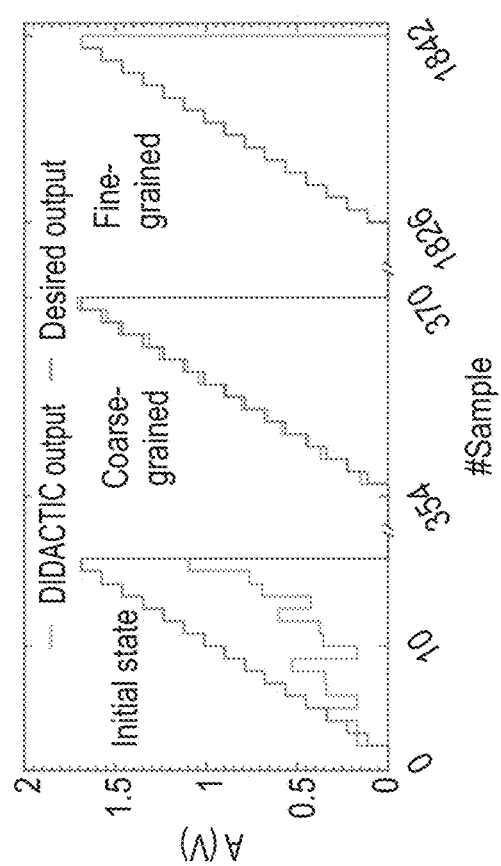
Figure 7D:
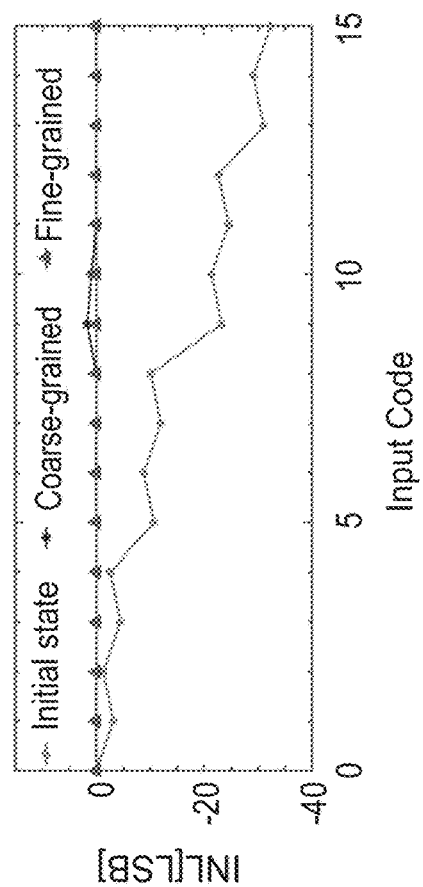
Figure 7A:
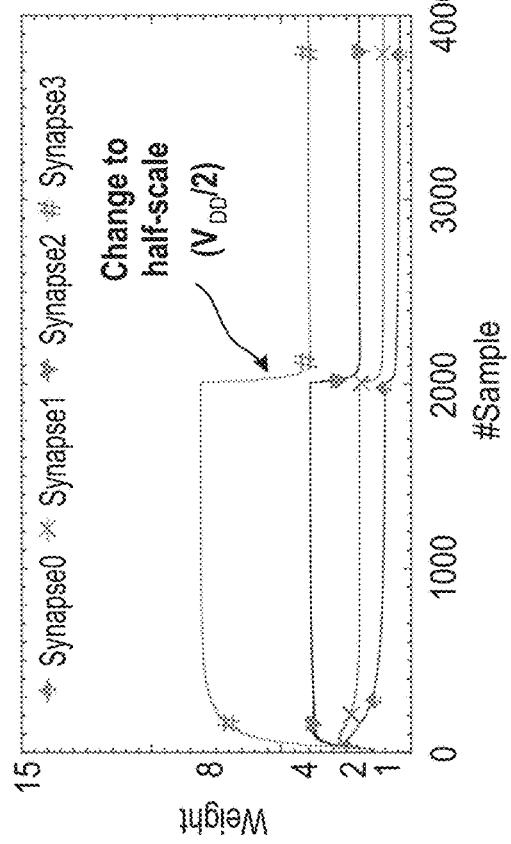
Figure 7C:
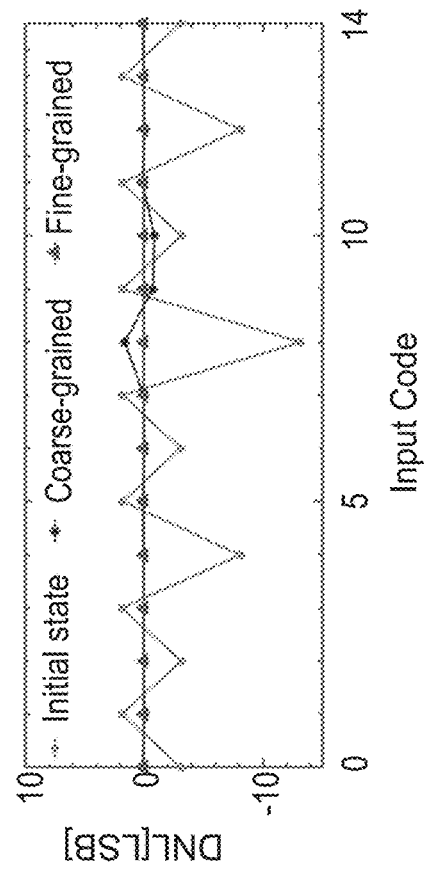
Figure 8B:
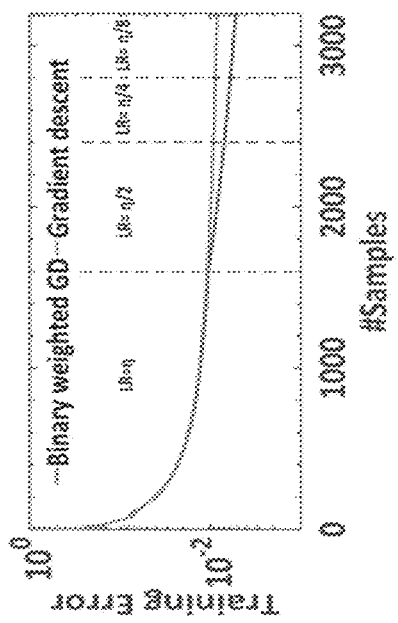
Figure 8D:
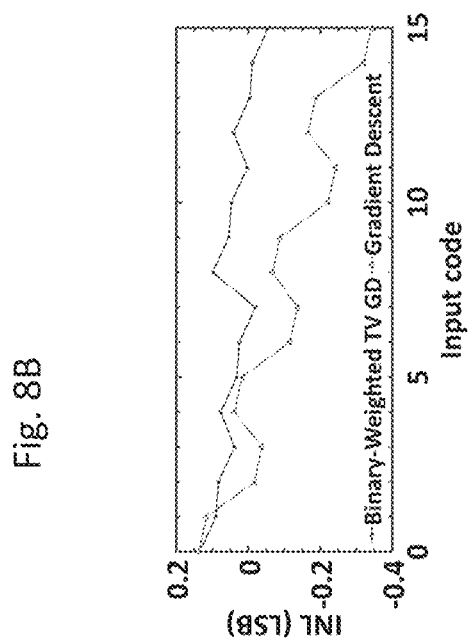
Figure 8A:
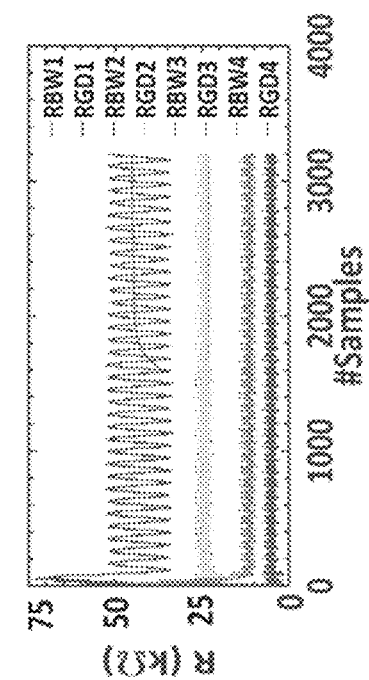
Figure 8C:
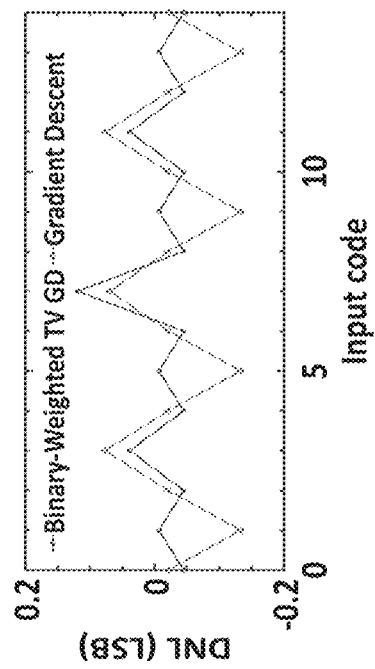
Figure 11:
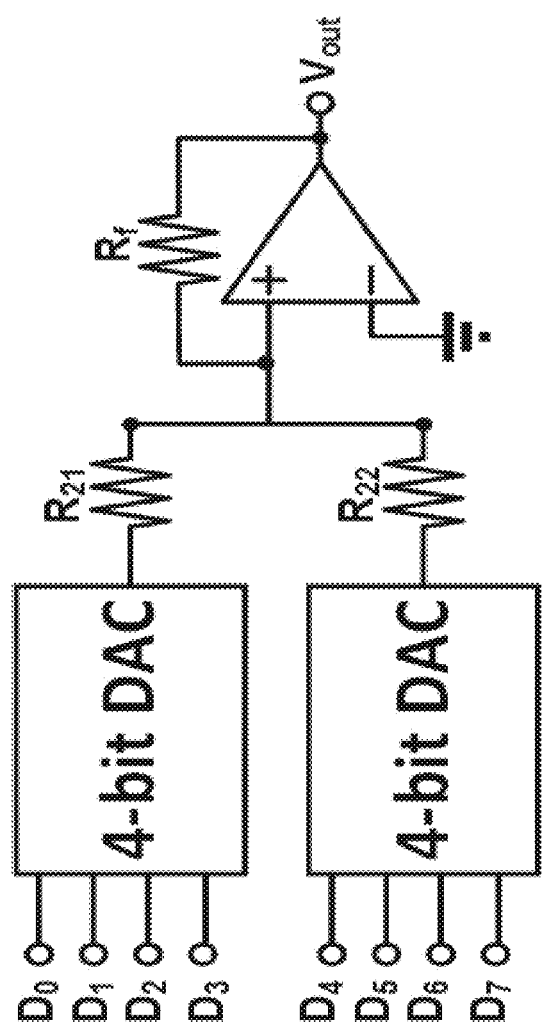
Figure 12:
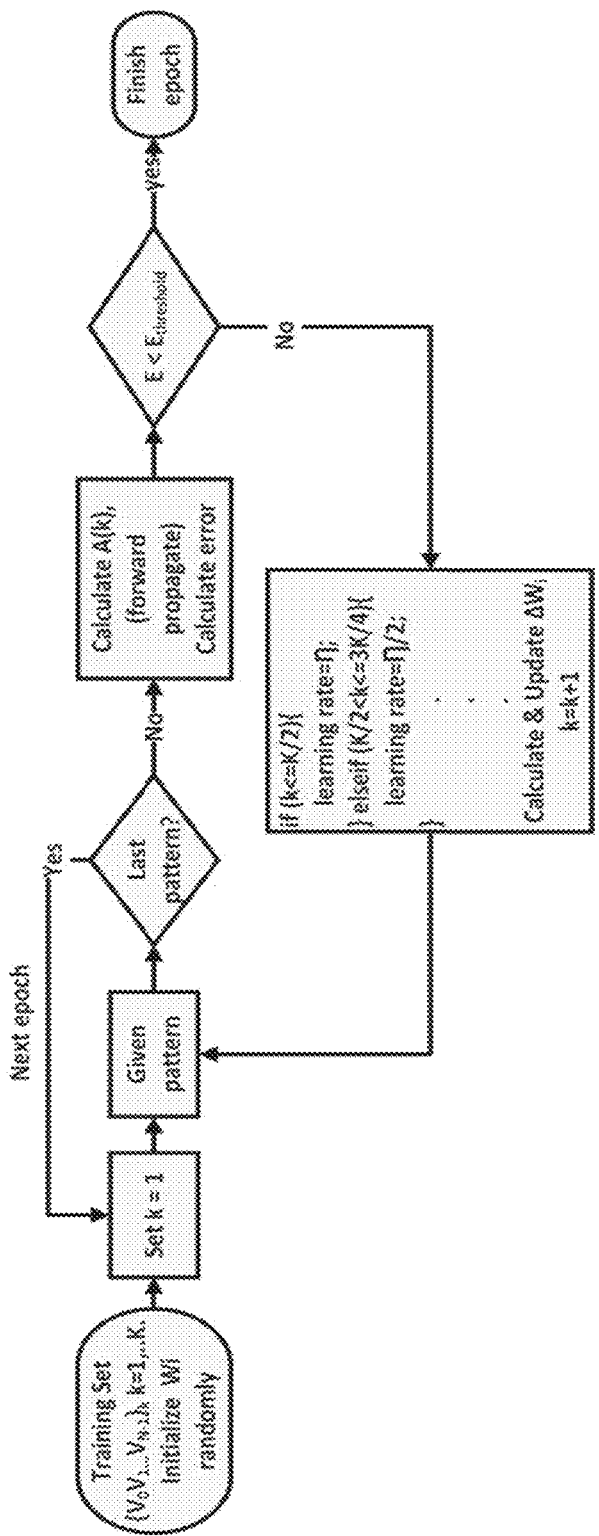

FIG. 7A shows a binary-weighted synaptic adaptation during the training phase for the 1.8V full-scale output voltage range, according to embodiments of the present invention;

FIG. 7B shows an exemplary comparison between the teaching dataset and the actual neural discrete analog DAC output at three different time stamps during the training, according to embodiments of the present invention;

FIG. 7C shows an exemplary differential, according to embodiments of the present invention;

FIG. 7D shows exemplary integral non-linearities of the DAC at three different time stamps in response to the DC input voltage ramp, according to embodiments of the present invention;

FIGS. 8A-8D show exemplary comparisons between regular gradient descent (GD) and the binary-weighted time-varying gradient descent (BW TV GD) algorithms of the present embodiments in the presence of noise and process variations, in FIG. 8A the GD fails to converge the synapses, whereas the BW TV GD succeeds and outperforms the GD, FIG. 8B shows smaller MSE, FIG. 8C shows better DNL, and FIG. 8D shows better INL;

FIG. 9A shows exemplary statistical simulations of randomly generated variations and noise sources and a probability distribution of typical and extreme cases in terms of the effective number of resistive levels, according to embodiments of the present invention;

FIG. 9B shows the impact of exemplary variations in the number of effective levels on the number of training samples in each case, according to embodiments of the present invention;

FIG. 9C shows ENOB as a function of the number of stable resistive levels, where the minimum is five uniformly distributed binary-weighted levels, according to embodiments of the present invention;

FIG. 9D shows an example of how endurance degradation along device lifetime, in terms of full switching cycles, logarithmically affect $\Delta R$ in each training sample and are compensated for by the increasing training time for the whole epoch, according to embodiments of the present invention;

FIG. 10A shows an exemplary high impedance state $Z_{OFF}$ as a function of sampling frequency; dashed lines indicate the maximum possible frequency bandwidth for a half- to full-scale voltage range with a high-to-low-impedance ratio of 32 and 16, respectively, according to embodiments of the present invention;

FIG. 10B shows an exemplary DAC reconfiguration for a 10 MSPS sampling frequency, by continuous synaptic update. The frequency-dependent variations were captured by the synaptic weights, according to embodiments of the present invention;

FIG. 11 shows an eight-bit reconfigurable DAC composed from two four-bit DACs by using a two-layer neural network according to embodiments of the present invention; and FIG. 12 shows a simplified flow of the online binary-weighted time-varying gradient descent training algorithm, which updates the weights according to the error function, according to embodiments of the present invention.

DESCRIPTION OF SPECIFIC EMBODIMENTS OF THE INVENTION

The present invention, in some embodiments thereof, relates to a reconfigurable digital to analog converter (DAC) and, more particularly, but not exclusively, to such a DAC that uses a trainable integrated circuit and that is implemented using a memristor based neural network.

In an increasingly data-diverse world, where reciprocal data are interactively transferred at high data rates, there is an ever-growing demand for high-precision data converters, and the present embodiments may provide a digital to analog converter that is constructed using a neural network layer, based on the above-discussed equivalence between a single layer neural network and a DAC. The convertor has inputs for receiving parallel bits of a digital input signal and an output for outputting an analog signal which is based on the digital input. Connecting the input and the output is a neural network layer which is configured to convert the parallel bits into an output analog signal that is representative of said digital input signal. The neural network may be hardwired and the synapses may rely on memristors as programmable elements.

That is to say, the present embodiments investigate digital-to-analog converter (DAC) configuration and calibration using an artificial intelligent neural network technique. The present embodiments are demonstrated on an adaptive and self-calibrated binary-weighted DAC that can be configured on-chip in real-time. The configuration uses an online supervised machine learning algorithm called binary-weighted time-varying gradient descent to fit multiple voltage ranges by iterative synaptic adjustments, while providing inherent calibration. The present embodiments provide an exemplary 4-bit DAC implementation using a memristor-based neural network. Theoretical analysis, as well as simulation results, show the efficiency of the training algorithm in reconfiguration and self-calibration, to significantly improve the DAC precision in terms of INL and DNL.

The present embodiments investigate approaches for digital to analog conversion by artificial intelligence-based techniques. An approach to design a generic high-precision, high-speed and energy-efficient DAC using Artificial Neural Networks (ANNs) and neuromorphic computing is provided herein.

Encouraged by the immense computational power of neuromorphic techniques, emergent collective characteristics may be interpolated into DAC design. Parallelism, simplicity, fault tolerance and energy-efficiency are just a few examples of such attractive properties beyond conventional DACs. Besides the quantitative equivalence, neuromorphic computing is a platform for mixed-signals circuits that inherently combines conversion procedures, abstracting biophysical dynamics in analog and digital domains.

The trainable, adaptive and self-repairing capabilities that follow machine learning algorithms may be considered as intelligent features suitable for the next generation DACs. By utilizing the massive amount of correlated data, it is possible to take future predictions and make online cognitive decisions for DAC configuration and calibration.

In an ANN solution of the present embodiments, memristor technology may be used to mimic synapses in the realization of artificial neural systems. The recent advent of nanoscale memristive integrated technologies for ANNs potentially can offer brain-like density for their size, analog storage properties, low energy, and non-volatility. The present embodiments may leverage the use of memristors as synapses in neuromorphic circuit-based DAC to achieve high precision, low power consumption and configurable neuro-inspired architecture.

The 4-bit binary-weighted DAC of one of the exemplary embodiments consists of an adaptive single-layer neural network, based on hybrid CMOS memristor mixed-signal circuit design. The conductance of the memristors may be adjusted on chip by a gradient descent training algorithm as explained herein. The algorithm may use different full scale analog training signals to flexibly adjust the memristors' conductance online for configurable DAC. The proposed DAC may be capable of self-calibrating device mismatches and process variations which alleviate non-linear distortions, improve the
effective number of bits (ENOB) and achieve almost ideal static figures of merit (INL/DNL≈0 LSB).

The method may be used over different full-scale voltages, sampling frequencies, and numbers of bits.

Figure 1:
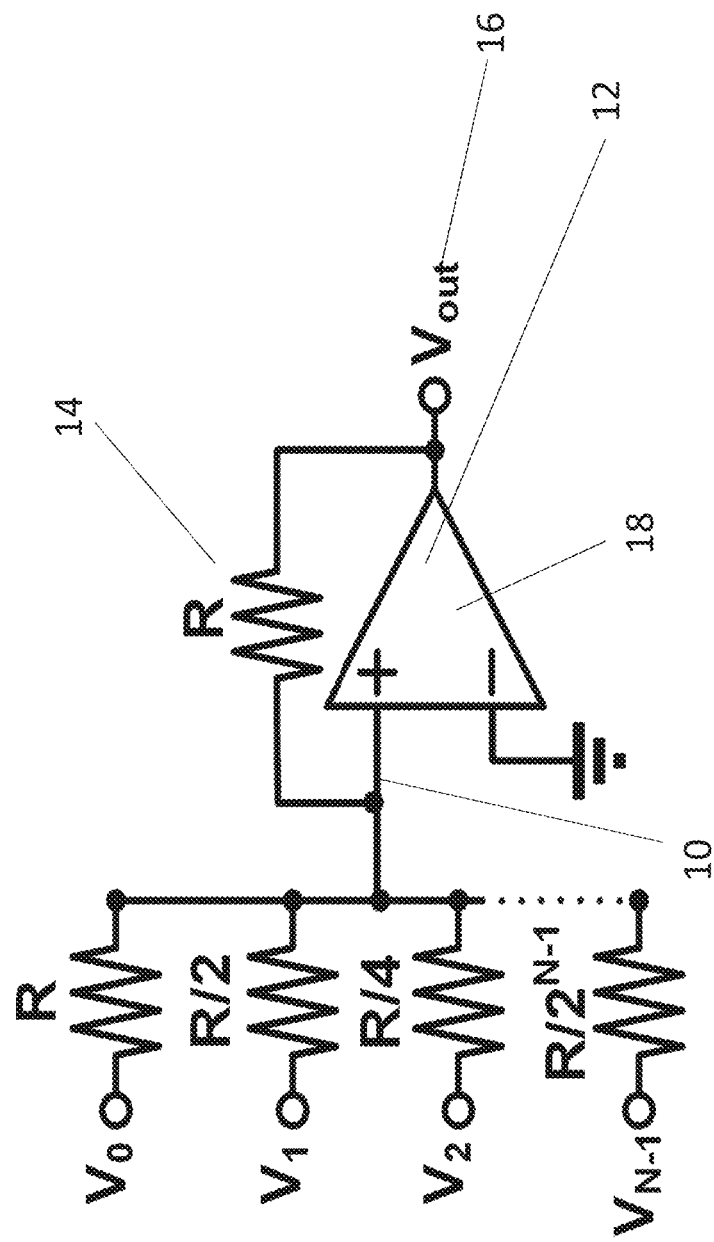
FIG. 1 is a simplified diagram illustrating a prior art digital analog converter DAC.

For purposes of better understanding some embodiments of the present invention, as illustrated in FIGS. 2-6 of the drawings, reference is first made to the construction and operation of a binary weighted resistor based DAC as illustrated in FIG. 1. N inputs $V_0$-$V_{N-1}$ are provided via different resistances, R, R/2, R/4, R/8 . . . R/$2^{N-1}$, so that the total input provided to the negative input 10 of Op Amp 12 is a weighted sum of the N inputs. A feedback resistor R 14 is connected between the output 16 and the negative input 10 and the positive input 18 is grounded.

FIG. 1 illustrates the simplest type of DAC, which uses a binary weighted style architecture, where N (number of bits) binary-weighted distributed elements, here resistors, are combined to provide a discrete analog output with finite resolution. As explained in the background, the binary-weighted DAC is based on a very simple and intuitive concept, and utilizes the fundamental rule-of-thumb binary to decimal basis transformation. The DAC employs the characteristics of the inverting summer operational amplifier circuit and negative feedback resistor. In this type of DAC, the output voltage is the inverted sum of all the input voltages.

Digital inputs follow full-scale binary voltages, so that '1' is equivalent to Vdd, and similarly '0' is equivalent to 0 V. The LSB input is connected to the highest resistance value equals to the feedback resistance R. Accordingly, the MSB input is connected to the lowest resistance value R/$2^{N-1}$, and the intermediate bits are determined according to their respective intermediate binary weights. The resulting discrete voltage of the amplifier output is as given in equation (1) above.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 2:
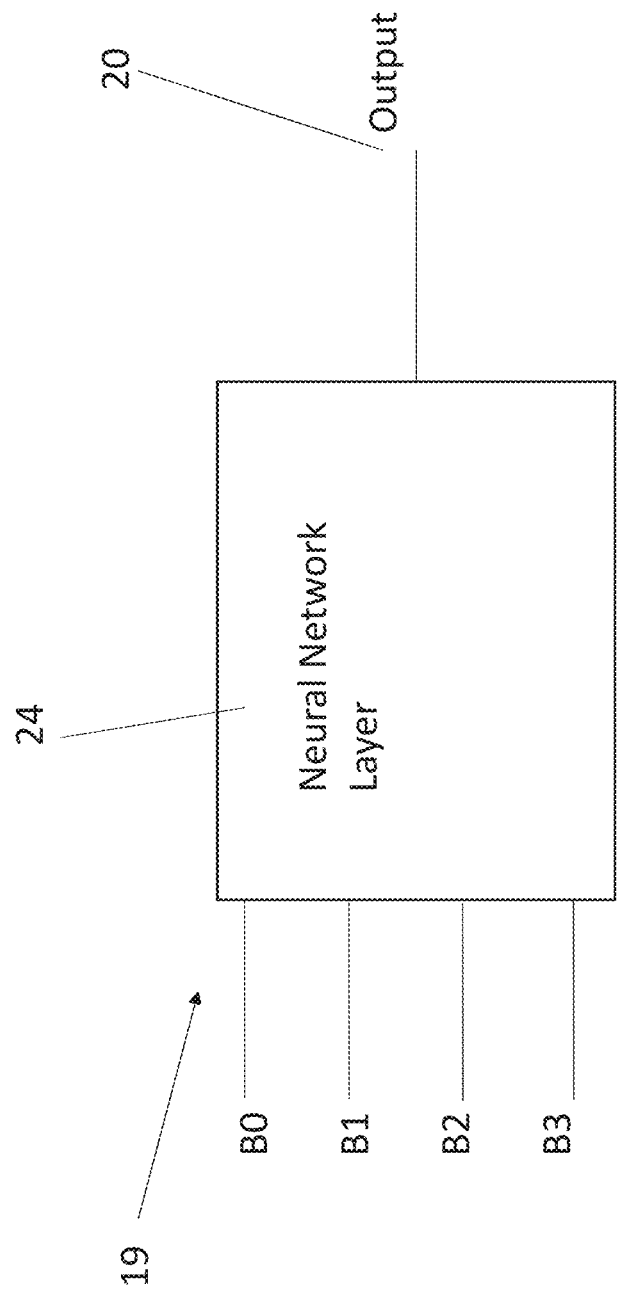
FIG. 2 is a simplified diagram illustrating a DAC constructed using a neural network layer according to an embodiment of the present invention.

Reference is now made to FIG. 2 which illustrates a digital to analog converter 19 comprising inputs B0-B3 for receiving parallel bits of a digital input signal. The digital input is generally (but not necessarily) binary, so each input is a power of two of the previous input and will typically have half the frequency if say the signal is simply counting up or down. An output 20 produces the analog signal, which may be a discrete analog signal such as will be discussed in greater detail below.

The inputs and the output are connected via a neural network 24 layer and the network converts the parallel bits into an output analog signal representative of the digital input signal as a whole. The neural network is programmable via learning, as will be discussed in greater detail below, so that weights applied to the various inputs can be altered. Alterations may be necessary for example when changes are made to the characteristics of the input signal. Thus the frequency of the input signal may change due to programming changes or changes of use of a device, or even due to the device being placed in an environment with a different temperature. Likewise the same DAC component may be placed in different systems with different specifications and the different specifications may be compensated for by carrying out a learning process on the neural network.

Figures 3A, 3B, 3C:
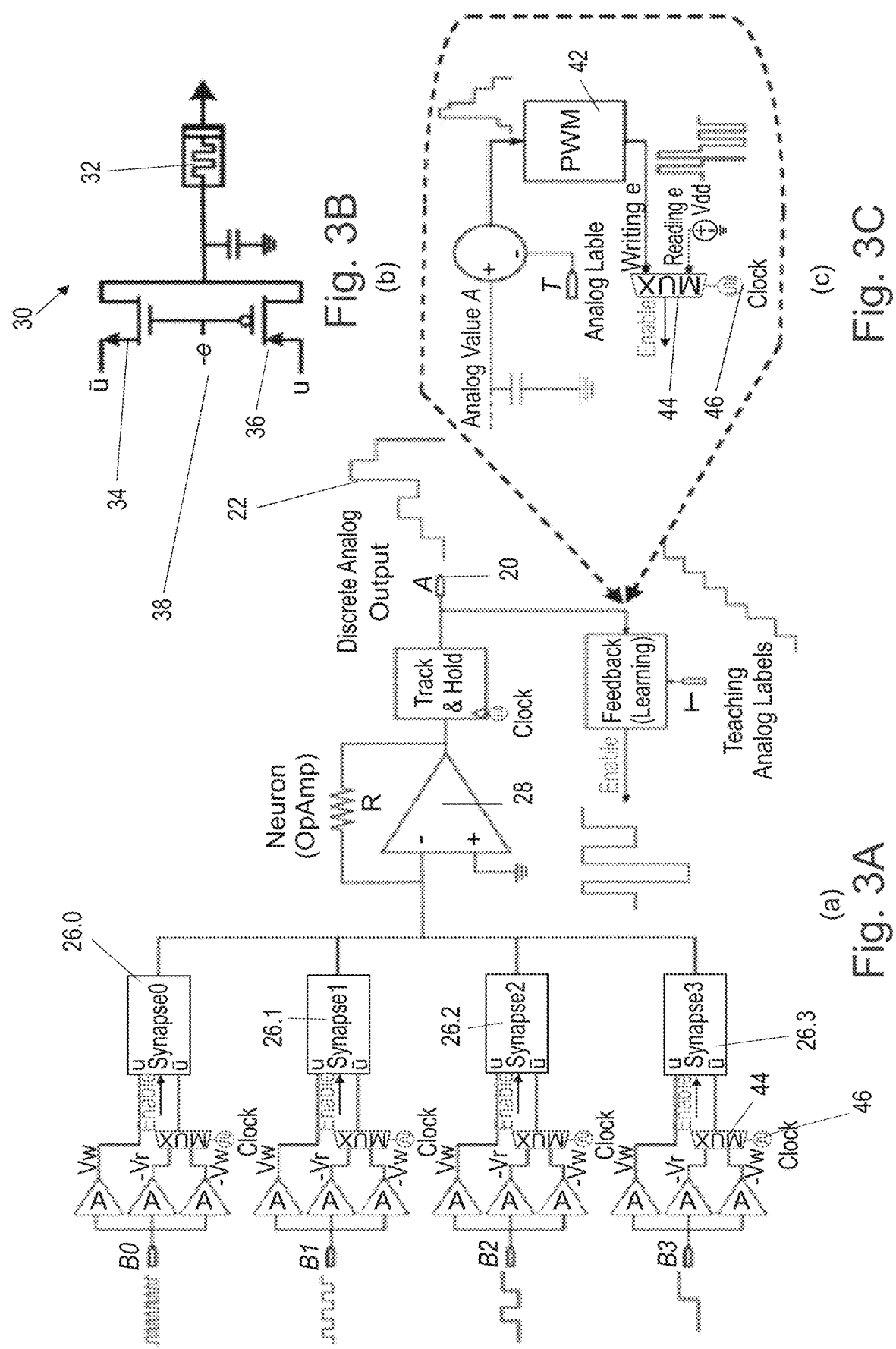
FIG. 3A is a simplified diagram of the embodiment of FIG. 2 in greater detail.
FIG. 3B is a simplified diagram of a synapse of neural network constructed using a memristor according to an embodiment of the present invention.
FIG. 3C is a simplified diagram showing a feedback loop for using learning to update weightings at the synapses according to an embodiment of the present invention.

Reference is now made to FIG. 3A, which shows the DAC component 19 of FIG. 2 in greater detail. As before, inputs B0-B3 receive parallel bits of a digital input signal. The digital input is generally (but not necessarily) binary, so each input is a power of two of the previous input and will typically have half the frequency if say the signal is simply counting up or down. Output 20 produces the analog signal, which may be a discrete analog signal such as signal 22 shown.

The inputs and the output are connected via neural network 24 layer and the network converts the parallel bits into an output analog signal representative of the digital input signal as a whole. The neural network takes on the task of the bank of resistors in FIG. 1 to take into account that more significant bits contribute more to the overall value and less significant bits contribute less. In order to deal with the significance of each bit, a weighting is applied, but in this case the weightings are contained in synapses 26.0 ... 26.3. Each synapse is modifiable, that is it can be adapted so that the weighting can be changed. The weightings are changed in a write cycle of a learning process, as will be discussed below, and each synapse 26.0 ... 26.3 is connected to one of the inputs, for which it is set with the appropriate weighting. The output 20 is connected to all of the synapses and op amp 28 integrates the signals received from the different synapses to generate a combined synapse signal from which to provide the output analog signal 22.

Reference is now made to FIG. 3B which shows an exemplary circuit 30 for a synapse according to the present embodiments. Each adaptable synapse comprises a memristor 32, which is the component that contains the weighting and is adjusted in the write cycle. In use, the memristor 32 is set with a weight that is obtained via learning for the particular input to which it is connected. The memristor 32 is for example connected to the common drain of two complementary MOSFETs 34 and 36, being NMOS and PMOS respectively. The sources of the MOSFETs provide positive and negative inputs for the signal and the common gate of the two MOSFETs provides an enable input 38 which allows writing to the memristor when set.

Thus the synapses have enablement inputs, and weightings can be configured using the feedback when the enable inputs are set, as will be explained below. When the enable inputs are not set then the feedback, even if available, has no effect.

The adjustable weightings are set via the feedback process to minimize an error measured in the discrete analog output based on a known input. That is to say a known training input is provided, so that the expected output is known. The actual output is measured and the weightings are adjusted until the error is minimized or eliminated. In an embodiment the error minimization is carried out using successive iterations of a stochastic gradient descent, and an example of a stochastic gradient descent uses iterations of $$\Delta W_i^{(k)} = -\eta \frac{\partial E}{\partial W_i^{(k)}} = -\eta \frac{\partial E}{\partial A^k} \cdot \frac{\partial A^{(k)}}{\partial W_i} = -\eta(A^{(k)} - t^{(k)})V_i^{(k)}$$

where $W_i^{(k)}$ are the respective weights for the $k^{th}$ sample, $\eta$ is a learning rate and $Vi^{(k)}$ is a single empirical sample of the known training input and is provided to the input at the $k^{th}$ iteration.

The embodiments are now considered in greater detail. To the best of the authors' knowledge, a neural based DAC is not known. The present embodiments may exploit the intelligence properties of the neural network to achieve adaptive DAC as trained online by a machine learning (ML) algorithm such as that provided herein. For example, consider the following supervised learning task. Assume a learning system that operates on K discrete trials, with N digital inputs $^{(k)}$, actual discrete output $^{(k)}$ according to (4) and desired labeled output (teaching) $^{(k)}$. Wi is tuned to minimize the mean square error of the DAC through the training phase $$E = \tfrac{1}{2}\Sigma_{k=1}^{K}(A^{(k)} - t^{(k)})^2 \quad (5)$$

A reasonable iterative update rule for minimizing objective (5) (i.e., updating W where initially W is arbitrarily chosen) is the following online stochastic gradient descent iteration $$\Delta W_i^{(k)} = -\eta \frac{\partial E}{\partial W_i^{(k)}} = -\eta \frac{\partial E}{\partial A^k} \cdot \frac{\partial A^{(k)}}{\partial W_i} = -\eta(A^{(k)} - t^{(k)})V_i^{(k)} \quad (6)$$

where $\eta$ is the learning rate, a small positive constant, and for each iteration k, a single empirical sample V (k) is chosen randomly and presented at the input of the system. This learning algorithm is called Adaline or LMS, and is used in adaptive signal processing and control systems.

It is noted that the update rule (6) is local, i.e., the change in synaptic weight Wi depends only on the related components, e.g., actual output A, desired output t, and digital input Vi. This local update, which ubiquitously appears in neural network training and machine learning algorithms, enables a massively parallel acceleration. The present embodiments may slightly modify the update rule (6) to guarantee a global minimum and fine tune the weights proportionally to their degrees of significance utilizing locality. Thus, for example, if the MSB has converged to its desired weight while the LSB is still adjusting iteratively, then we may avoid disturbing the MSB weight.

The LSB may in one embodiment represent the precise quantum and may follow the longest resolution match, termed the "binary-weighted time varying gradient descent" learning rule as follows:

$$\Delta W_i^{(k)} = -\eta(t)(A^{(k)} - t^{(k)}) \cdot V_i^{(k)}, \quad (7)$$

where $\eta(t)$ is a time varying learning rate, decreasing in a binary-weighted manner along with the training time. The expression for $\eta(t)$ is $$\eta(t) = \begin{cases} \eta & \text{if } k \leq K/2 \\ \eta/2 & \text{if } K/2 < k \leq 3K/4 \\ \cdots \\ \eta/2^{N-1} & \text{if } (2^{N-1}-1) \cdot K/2^{N-1} < k \leq (2^N - 1) \cdot K/2^N \end{cases}$$

In an alternative embodiment, the LSB, which represents the most precise quantum, requires the longest resolution match and the lengthiest training time to converge. While the MSB can quickly achieve a stable value, the LSB may still present oscillations, thus continuously changing the collective error function in (5). Concurrently, the MSB will be disturbed and swing back and forth recursively in a deadlock around a fixed point. This problem is aggravated in the presence of noise and variations, and ameliorated by using smaller learning rates. Hence, we propose a slightly modified update rule to guarantee a global minimum of the error, and to fine-tune the weights proportionally to their significance degree. We call the modified rule the binary-weighted time-varying gradient descent learning rule, expressed as $$\Delta W_i^{(k)} = -\eta(t)(A^{(k)} - t^{(k)}) \cdot V_i^{(k)}, \quad (7.1)$$

where $\eta(t)$ is a time-varying learning rate, decreasing in a binary-weighted manner along with the training time, as shown in FIG. 2. The expression for $\eta(t)$ is $$\eta(t) = \begin{cases} \eta & \text{if } k \leq K/2 \\ \eta/2 & \text{if } K/2 < k \leq 3K/4 \\ \cdots \\ \eta/2^{N-1} & \text{if } (2^{N-1}-1) \cdot K/2^{N-1} < k \leq (2^N - 1) \cdot K/2^N \end{cases}$$

The learning rule of equation 7.1 utilizes the convergence time acceleration and the decaying learning rate to reduce bit fluctuations around a fixed point. Hereinbelow, we show that this learning rule is better than (6) in terms of training time duration, accuracy, and robustness to learning rate non-uniformity.

The present embodiments may leverage the conceptual simplicity, parallelism level, and minimum die size of the binary-weighted DAC of FIG. 1 by implementing online gradient descent in hardware. Such an implementation may achieve a scalable, accurate and adaptive DAC that may be used for high-speed and high-precision applications. In FIG. 3A a 4-bit DAC architecture is shown, based on memristive weights and a feedback circuit to regulate the values of the weights according to equation (7).

The supervised learning process is possible by interchangeable synchronous read and write cycles, thus utilizing the same execution path for both read and write operations in-situ. Reading is the intended conversion phase, whose final result may be sampled at the end of the reading cycle after transient effects are mitigated, and latched by a negative edge triggered latch for the whole writing cycle. The writing cycle may activate the feedback circuit that implements the learning algorithm.

Artificial Synapse

The present embodiments may provide a synapse circuit which is composed of a single memristor connected to a shared terminal having two MOSFET transistors (p-type and n-type), in like manner to pass transmission gates, as discussed above in respect of FIG. 3B. The output of the synapse is the current flowing through the memristor. The synapse receives three voltage input signals: u and $\bar{u}=-u$ are connected, respectively, to the source of one of the two MOSFETs, and an enable signal e is connected to the common gate of both transistors. The enable signal may have a zero value so that neither transistor is conducting, or VDD so that only the NMOS is conducting, or −VDD so that only the PMOS is conducting. Thus, the magnitude of the input signal u should be less than the minimum conductance threshold $$|u| < \min(V_{T_n}, |V_{T_p}|) \qquad (8)$$

The writing voltage $V_w$ that modifies the synaptic weight based on the enable signal may be inserted as an input u (and $\bar{u}$) via the common source terminal of both the transistors, and using the VTEAM model referred to above, may be bigger than the threshold voltage for memristive switching.

$$|V_{th_t}| < |V_w| < \min(V_{T_n}, |V_{T_p}|) \qquad (9)$$

The read voltage Vr is very small relatively to the memristor switching threshold, and accumulative read does not disturb the memristance value over multiple read iterations. In the reading cycle only the NMOS of the two complementary transistors conducts and $e = V_{dd}$, with negative read voltage to eliminate the inverting Opamp input.

$$|V_r| < |V_{th_t}| \qquad (10)$$

An advantage of the low voltages possible with the above arrangement is the low power consumption, so that the low subthreshold current leakage which threatens the memristance accuracy is attenuated. That is to say Vw and Vr are attenuated voltages of the digital DAC inputs which may fit the design constraints provided in equations (9) and (10). A shock absorption capacitor may be added to eliminate spike fluctuations derived from either subthreshold leakage or high frequency switching. In embodiments, the memristor right terminal is connected to the virtual ground of the Op Amp.

The assumption of ohmic operation is valid only if the conductance of the memristor is much smaller than the effective conductance of the transistor, as follows, $$R_{mem}(s(t)) \gg \frac{1}{K(V_{DD} - 2\max(V_{T_n}, V_{T_p}))}, \qquad (12)$$

where K is a technology dependent constant that describes the transistor conduction strength, $V_{DD}$ is the maximum power supply, s is the memristor internal state variable distributed between [0-1], and $R_{mem}$ refers to the memristor resistance as a function of the state variable s. The latter relationship is chosen to be linear.

$$R_{mem}(t) = S(t) \cdot (R_{OFF} - R_{ON}) + R_{ON}. \qquad (13)$$

As a result, the memristor resistance level that could be achieved during training is lower bounded. Otherwise, the applied voltage over the memristor during the write cycle will not be sufficient to stimulate it. This constraint is achieved by the following condition:

TABLE 2

| Circuit Variations & Noise | | |
|---|---|---|
| Type | NOMINAL VALUE | Variance |
| Device mismatch | | |
| Resistor | W = 2 um | ±0.5% um |
|  | R = 50 Ω/ |  |
| Capacitor | W = 0.15 um | ±1% um |
|  | $C_A$ = 0.68 fF/um² |  |
| NMOS/PMOS | W/L | ±10% |
|  | $V_T$ | ±7% V |
| Comparator | $V_{offset}$ | ±5 mV |
| Memristor | $V_{on/off}$ | ±10% V |
|  | $K_{on/off}$ | ±10% mm/s |
|  | $R_{ON}$ | ±10% Ω |
|  | $R_{OFF}$ |  |

TABLE 2-continued

Circuit Variations & Noise

| Type | NOMINAL VALUE | Variance |
|---|---|---|
| Noise sources | | |
| Thermal noise | $2\,kT\,g_1^{-1}$ | $10^{-16}V^2s$ |
| IR drop | $V_w$ | $\pm 10\%\,V$ |
| Pulse-width modulation noise | White noise | 50 ps |
| Labels noise | $\dfrac{V_{FS}}{2^{N+1}} = 56.25\,mV$ | $\dfrac{V_{FS}}{2^{N+1}\sqrt{3}} = 32.5\,mV$ |
| Frequency-dependent noise and variations/aging | | |
| Input switching noise | LdI/ddt | $\pm 10\%\,V/\sqrt{Hz}$ |
| Opamp input noise | 1/f flicker noise | $10\,nv/\sqrt{Hz}$ |
| Slew rate | $2\,\pi f V_{FS}$ | 1.13 V/ns |
| Memristor OFF impedance | $R_{OFF}$ | $R_{OFF}\dfrac{R_{OFF}}{\sqrt{(1+(R_{OFF}C_{mem}\cdot 2\pi f)^2}}$ |

$$|V_w|\frac{R_{mem,min}(s_{min}(t))}{\frac{1}{K(V_{DD}-2V_T)}+R_{mem,min}(s_{min}(t))} \geq |V_{th,mem}|. \quad (14)$$

The voltage division creates non-uniformity in the writing voltage of each cycle and may explicitly affect the learning rate. A shock absorption capacitor may be added to eliminate fluctuation spikes derived from either subthreshold leakage or high frequency switching. Its value is bounded by the sampling frequency of the DAC, $$\frac{1}{K(V_{DD}-2V_T)}C_{shock,max} \leq \frac{1}{f_s}. \quad (15)$$

Artificial Neuron

The neuron may be implemented by an operational amplifier with a negative feedback resistor R. The neuron may receive currents from N memristors and may sum them simultaneously, as follows:

$$A \approx -\sum_{i=0}^{N-1}\frac{R_f}{R_{mem_i}}V_i, \quad (16)$$

where $V_i$ is a read voltage via a memristor with index i, which represents the digital input value of the i-th bit. In the reading cycle, only the NMOS transistor is conducting since $e=V_{dd}$, with a negative read voltage to eliminate the inverting sign of the operational amplifier. The resolution of the DAC, which equals the minimal quantum, is defined by $r=V_{FS}/2^N$. The maximum analog output is achieved when the digital input '11 . . . 11' is inserted, and is equal to $A_{max}=(2^N-1)V_{FS}/2^N$. Therefore, the read voltage equals $V_r=r=V_{FS}/2^N$, and it should obey the constraints in (11). Based on this read voltage, bounds on the number of resolution bits that the DAC could hold were formalized. From (11), we extract the minimal number of resolution bits, $$N_{min} \geq \left\lceil\log_2\left(\frac{V_{FS}}{\min(V_{T_n},V_{T_p})}\right)\right\rceil, \quad (17)$$

where the maximal number of resolution bits is bounded by the binary-weighted levels within the dynamic range of the memristor, $$N_{max} \leq \log_2\left(\frac{R_{OFF}}{R_{ON}}\right).$$

Because of the serial transistor resistance, however, it is undesirable to use surrounding levels. Doing so decreases the number of bits by $$\log_2\left[\frac{1}{R_{ON}K(V_{DD}-2V_T)}\right],$$

which is approximated to be zero in our case because $R_{ON}>>1/K(V_{DD}-2V_T)$. Additionally, in the case of smaller full-scale voltage, some levels should be reserved. For example, if the full-scale voltage is half of the maximum power supply $V_{FS}=V_{DD}/2$, then the highest binary-weighted level should be reserved. Doing so will decrease the effective number of bits by $$\left\lceil\log_2\left(\frac{V_{DD}}{V_{Fs,min}}\right)\right\rceil.$$

The maximum number of bits that the proposed DAC could convert is up to $$N_{max} \leq \log_2\left(\frac{R_{OFF}}{R_{ON}}\right)-\log_2\left[\frac{1}{R_{ON}K(V_{DD}-2V_T)}\right]-\left\lceil\log_2\left(\frac{V_{DD}}{V_{Fs,min}}\right)\right\rceil. \quad (18)$$

In this case, if the minimal full-scale voltage is $V_{FS}=V_{DD}/2$, then the number of bits that could be converted by a DAC with the device parameters listed in Table I is at most four.

In the same context, the feedback resistor is upper-bounded by the minimal full-scale voltage and the highest resistance of the memristor, $$R_f \leq \frac{R_{OFF} V_{FS}}{V_{DD}}, \quad (19)$$

when considering bi-directional variations of the training above and below the fixed resistance level, respectively. These variations are evaluated as ±10% of the nominal value.

Feedback Circuit

Reference is now made to FIG. 3C, which illustrates a feedback circuit 40. The feedback circuit 40 is the component in the binary weighted gradient descent algorithm execution that may precisely regulate the synaptic adaptation procedure. The present embodiments may synthesize hardware and implement subtraction and multiplication operations.

The subtraction or error discrete voltage product may be pulse modulated by pulse width modulator (PWM) 42 with time width linearly proportional to the error and ±$V_{dd}$, 0 V pulse levels. The PWM product may be transmitted via feedback to the synapse 26.0 . . . 26.3 as an enable signal. Therefore multiplication may be invoked as an AND logic gate and controlled by the modulated enable signal, while the attenuated digital input is connected via the source connection of the synapse. The attenuation is carried out to stand in for four different operational voltages that generate a binary-weighted update ratio as specified in Table 1. The learning rate is a key factor of the adaptation performance and depends on the selected circuit's parameters listed in Table 1. Multiplexer 44 with clock 46 sets or resets the enable input 38.

Figure 3D:
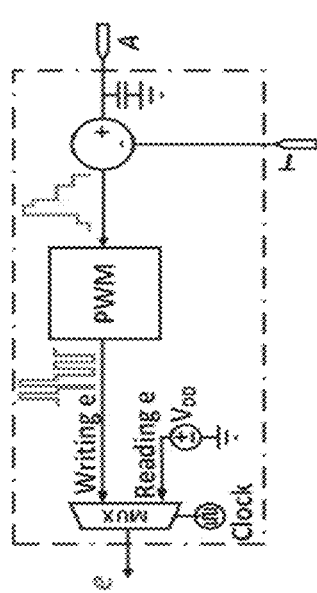
FIG. 3D is a simplified diagram showing a feedback circuit for a gradient descent learning algorithm.
Figure 3E:
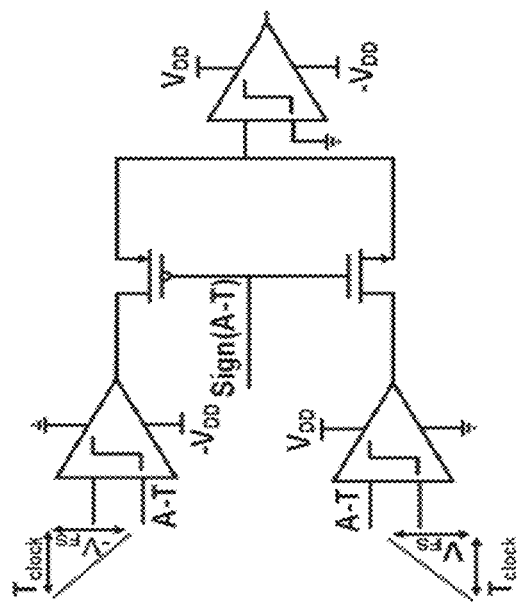
FIG. 3E is a simplified schematic diagram of a PWM circuit that generates fixed amplitude pulses with a time width proportional to the subtraction product between the real and teaching signals.

FIG. 3D shows a feedback circuit for the gradient descent learning algorithm, and FIG. 3E shows a schematic of a PWM circuit that generates fixed amplitude pulses with a time width proportional to the subtraction product between the real and teaching signals.

Results & Evaluation

The 4-bit DAC is implemented, synthesized in a SPICE simulation using CMOS 0.18 um process and the VTEAM memristor model mentioned above and tested. The circuit parameters, architectural specifications and design constraints are listed in Table 1. First, the basic deterministic functionality of a 4-bit DAC is demonstrated while being trained by an online binary-weighted time varying gradient descent algorithm. Two sawtooth training datasets with different voltage ranges are given to show how the network converges from a random initial state to a steady state once the error is smaller than a sufficient threshold.

The DAC may be evaluated in terms of accuracy and training speed as illustrated in FIG. 4. FIG. 4(a) shows binary synaptic weighted adaptation during the training phase for a 1.8V full-scale output voltage range. FIG. 4(b) is a comparison between a teaching dataset 50 and the actual "neural" discrete analog DAC output 52 over 3 different time stamps 54, 56 and 58 during the training process, and an identical staircase is achieved only in the last cycle 58, after the training is complete.

TABLE I

| CIRCUIT PARAMETERS | | | | | |
|---|---|---|---|---|---|
| Type | Parameter | Value | Type | Parameter | Value |
| Device parameters | | | Design Parameters | | |
| Power supply | $V_{DD}$ | 1.8 V | Shock capacitor | $C_{shock}$ | 100 pF |
| NMOS | W/L | 10 | Writing voltage | $V_W$ | 0.35 V |
| | $V_{T_n}$ | 0.5 V | Reading voltage | $V_r$ | −0.1125 V |
| PMOS | W/L | 20 | Feedback resistor | $R_f$ | 90 kΩ |
| | $V_{T_p}$ | −0.42 V | Reading time | $T_r$ | 5 µs |
| | $V_{on/off}$ | ±0.3 V | Writing time | $T_w$ | 5 µs |
| | $K_{on/off}$ | ±1 mm/s | | | |
| Memristors | $\alpha_{on/off}$ | 1 | | | |
| | $R_{ON}$ | 100 Ω | | | |
| | $R_{OFF}$ | 200 kΩ | | | |
| DAC parameters | | | Learning parameters | | |
| Sampling frequency | $f_s$ | 0.1 MSPS | Learning rate | η | 0.01 |
| Number of bits | N | 4 | Error threshold | $E_{threshold}$ | $2 \cdot 10^{-3}$ |
| Full-scale voltage | $V_{FS}$ | $\left[\frac{V_{DD}}{2} - V_{DD}\right]$ | | | |

FIG. 4(c) shows a synaptic weights adaptation which is trained for a 0.9V full-scale output voltage range, in the presence of ±10% process variations of every circuit element. FIGS. 4(d & e) shown integral and differential non-linearities of the DAC, again over three different time stamps, before 60, during, 62 and after 64.

Note that the number of bits is bounded by the ratio between the highest and lowest resistance levels of the memristor, and the sampling frequency may be the Nyquist frequency.

Reference is now made to FIG. 5, which is a simplified flow chart illustrating a method for carrying out digital to analog conversion. The method comprises receiving parallel bits of a digital input signal—50 and passing the bits through a neural network layer—52. The different bits of the signal are sent via respectively weighted synapses to an output where they are combined or integrated—54—to form an output analog signal representative of the original digital input signal.

Reference is now made to FIG. 6, which is a simplified flow chart schematically illustrating an iteration of a training procedure for modifying the weights of the synapses. The weights may be modified in a set up phase when starting to operate new equipment and on subsequent occasions, say when signal characteristics change or the operating environment changes.

A sequence of test signals is provided to the DAC, each signal providing an iteration—56. The signal propagates through the network and the output is latched 58. The error is measured against an expected output—60—and the current iteration of the online stochastic gradient descent is generated 42. The enable is set at the synapses and the new weight to minimize the error is written to the memristors—64.

Evaluation

In this section, the proposed four-bit DAC design is discussed and evaluated in a SPICE simulation using a 0.18 μm CMOS process and the VTEAM memristor model. First, the learning algorithm is evaluated in terms of mean square error (MSE) and training time. Then, a static evaluation of the circuit is described, and finally the dynamic evaluation is presented. The proposed DAC has been tested in both ideal and non-ideal cases. The circuit parameters, architectural specifications, and design constraints are listed in Table I.

Ideal Case

Reference is now made to FIGS. 7A-7D. FIG. 7A shows binary-weighted synaptic adaptation during the training phase for the 1.8V full-scale output voltage range. Immediately, synapses are trained for the 0.9V full-scale output voltage range and shown in real time. FIG. 7B shows a comparison between the teaching dataset and the actual neural discrete analog DAC output at three different time stamps during the training; an identical staircase is achieved after the training is complete. FIG. 7C shows a differential and FIG. 7D shows integral non-linearities of the DAC at three different time stamps in response to the DC input voltage ramp.

The basic deterministic functionality of the four-bit DAC is demonstrated while being trained by the online gradient descent algorithm. FIG. 7A shows the synapse resistive value where two sawtooth training datasets with different full-scale voltage ranges ($V_{DD}$, and $V_{DD}/2$) are applied successively in real time. It can be observed that the network converges from a random initial state to a steady state once the error determined by (5) is lower than $E_{threshold}$, after ~2000 training samples. Furthermore, it can be observed that when the full-scale voltage changes to $V_{DD}/2$, the system converges to a new steady state that quantizes 0.9V full-scale. In each case, the network is successfully reconfigured to operate under different specifications, as shown by different binary-weighted synaptic values in FIG. 7A.

The DAC is next evaluated in terms of accuracy and training time, as illustrated in FIG. 7B 7D. The static evaluation in response to the DC ramp signal at three different time stamps is shown in FIG. 7B for (I) the initial state before training, (II) coarse-grained training (i.e., where the error is slightly higher than $E_{threshold}$), and (III) fine-grained training (i.e., where the error is low enough and the DAC response converges to the final, desired state). The teaching staircase in FIG. 7B is the same DC ramp input that statically evaluates the DAC at the three given time stamps. Therefore, the differences between two adjacent digital input codes within the actual DAC output are the differential non-linearity (DNL), and similarly, the total voltage differences between the actual DAC output and the desired staircase for each digital input code are the integral non-linearity (INL). Results of the DNL and INL are shown, respectively, in FIGS. 7C and 7D.

As shown in FIGS. 7C and 7D, before the training state the DAC is completely non-linear and non-monotonic, with several missing codes. Thus, the maximum difference between the discrete analog output and the ideal staircase, and the maximum difference between two adjacent analog levels, are considerably high: INL≈−32 LSB, and DNL≈−13 LSB. At the second time stamp (2 ms~200 samples), however, the DAC performs better and appears monotonic but not sufficiently accurate (INL≈−1 LSB, DNL≈−1 LSB). After the training is complete (20 ms), the DAC is fully calibrated: INL≈0 LSB, and DNL≈0 LSB. The fact that the DNL and INL are almost ideal proves that the training algorithm achieves maximum performance. The DAC also showed robustness when it was simulated with a randomly generated training dataset.

The improvements in static figures of merit significantly affect the dynamic figures of merit. The ENOB is a function of signal-to-noise and distortion ratio, whereas the distortions are a result of the DAC's non-linearity. If the DAC is non-linear (e.g., INL, DNL≠0), then harmonic distortion spurs will appear in the dynamic response, degrading the ENOB. Therefore, improving the INL and DNL by learning and calibration techniques alleviates distortions and improves the ENOB, improving the precision of the DAC. To evaluate the ENOB, the DAC is dynamically evaluated and analyzed in response to a sine input with 40 kHz frequency, which meets the Nyquist condition: $f_{input} \leq f_s/2$. The achieved ENOB in the ideal case is 3.71, which is almost ideal considering the intrinsic quantization error. All the extracted performance metrics are summarized in Table III.

Non-Ideal Case

Reference is now made to FIGS. 8A-8D. FIG. 8A shows a comparison between regular gradient descent (GD) and the proposed binary-weighted time-varying gradient descent (BW TV GD) algorithms in the presence of noise and process variations. FIGS. 8B-8D show that the GD failed to converge the synapses, whereas the BW TV GD succeeded and outperformed the GD with FIG. 8B smaller MSE, FIG. 8C better DNL, and FIG. 8D INL.

Usually, analog domains suffer from reduced robustness and vulnerability to noise and variations in comparison to their digital counterparts. DACs are being continuously pushed towards their performance limits as technology scales down and system specifications become more challenging. While device mismatch and process imperfections in modern DACs can be compensated for by calibration mechanisms, noise can irreparably degrade performance and is less straightforward to capture at design time. Several analysis methods have been established to estimate noise sources and their impact on the performance. All these mechanisms are specific and technology dependent, requiring exhaustive characterization, massive validation, and relatively long development time-to-market. Adaptive intelligent systems motivated by machine learning algorithms are, however, inherently robust to noise, which is a key element in the set of problems they are designed to solve. This suggests that the effects of intrinsic noise on the performance of the analog circuit are relatively small. Therefore, online training algorithms are not exclusive to reconfiguration, but can also be used for self-calibration, adaptation, and noise tolerance with generic standard methodology.

For this reason, a crude estimation of the magnitude of noise and variability is listed in Table II:
1. The process variation parameters for the memristor are pessimistically chosen, with a coefficient of variation (CV=standard deviation/mean ~30%) to cover wide reliability margins. The variability in the parameters of the memristors is equivalent either to corresponding changes in the synaptic weights or to the learning rate q. In FIGS. 8A-8D, we show that the proposed binary-weighted time-varying gradient descent training algorithm is able to tolerate such process variations over time. The variability in the transistor parameters can also dramatically affect the learning performance; thus, transistor parameters such as $V_H$, W/L, and $V_T$ in Table I are chosen to guarantee a global optimal solution even in such extreme scenarios.
2. Noise sources include intrinsic thermal noise coming from the feedback resistor, memristor, and transistor, as well as pulse-width modulation noise, input referred noise, training label fluctuations as a result of supplier converter quantization noise, and frequency-dependent noise sources, which are quantified and estimated.
3. Frequency-dependent variations capture the parasitic capacitance and inductance of the memristor and model it by a varying impedance as a function of the frequency. In addition, ΔR degradation along switching cycles as a result of oxide defects and device aging is considered.

TABLE III

ACCURACY COMPARISON

| Type | Value |
|---|---|
| Ideal case—Gradient descent | |
| Maximum DNL | ≈0 |
| Maximum INL | ≈0 |
| ENOB | 3.71 |
| Training time | 20 ms |
| MSE | $2 \cdot 10^{-3}$ |
| Non-ideal case—Gradient descent | |
| Maximum DNL | 0.15 LSB |
| Maximum INL | 0.38 LSB |
| ENOB | 3.18 |
| Training time | 30 ms |
| MSE | $5 \cdot 10^{-3}$ |
| Non-ideal case—Binary-weighted time-varying gradient descent | |
| Maximum DNL | 0.11 LSB |
| Maximum INL | 0.12 LSB |
| ENOB | 3.63 |
| Training time | 30 ms |
| MSE | $2 \cdot 10^{-3}$ |
| Non-ideal case—Resistor-based DAC | |
| Maximum DNL | 1.28 LSB |
| Maximum INL | 0.81 LSB |
| ENOB | 2.66 |

While process variations determine the convergence time and accuracy, noise can cause the network to deviate from the optimum weights with destructive oscillations. In FIG. 8A, the training processes for both gradient descent and the binary-weighted time-varying gradient descent with decaying learning rate are shown. Observe that the regular gradient descent, which succeeded in stabilizing the synapses without the presence of noise, now fails to stabilize the synapses. Conversely, the binary-weighted time-varying gradient descent with decaying learning rate successfully overcame noise and variations with stable synapses. The comparison is made, accordingly, in terms of MSE, DNL, and INL, as shown in FIGS. 8B-8D, respectively. The switching non-linearity and threshold of the memristor device mitigate synaptic fluctuations derived from noise and variation sources. Nevertheless, the gradient descent algorithm fails to converge to a global optimum and keeps excessively capturing stochastic dynamics whereas the time-varying learning rate of the proposed algorithm enhances the network immunity against overfitting and achieves reliable predictive performance on unseen data.

Reference is now made to FIGS. 9A to 9D. FIG. 9A shows statistical simulations of randomly generated variations and noise sources show the probability distribution of typical and extreme cases in terms of the effective number of resistive levels. FIG. 9B shows the impact of variations in the number of effective levels on the number of training samples in each case. FIG. 9C shows ENOB as a function of the number of stable resistive levels, where the minimum is five uniformly distributed binary-weighted levels, and FIG. 9D shows endurance degradation along device lifetime, in terms of full switching cycles, logarithmically affect ΔR in each training sample and are compensated for by the increasing training time for the whole epoch. For robust validation of the DAC functionality in the presence of correlated variations and noise sources in Table II, we statistically analyzed the DAC performance for large numbers of randomly generated scenarios. We show the distribution of the achieved effective number of resistive levels in FIG. 9A. The number of resistive levels, however, is finite and is a function of variations, data retention, noise margin, and amplifier sensitivity. FIG. 9A shows that extreme cases where the write variation is ±10% and the comparator offset of the PWM is ±5 mV are less likely. Therefore, the effective number of resistive levels in the typical case (approximately 38% of the cases) is ~64. The number of resistive levels has a key role in achieving such adaptive, self-calibrated, noise-tolerant, and highly accurate DACs. Due to its self-calibration capability, the DAC can tolerate variations and compensate for them by imposing a penalty of more training samples, as shown in FIG. 9B. Alternately, fewer training samples or stable resistive levels are sufficient for lower accuracy, as shown in FIG. 9C, in terms of ENOB, lower-bounded by five uniformly distributed binary-weighted levels covering a half- to full-scale voltage range. Results of the dynamic evaluation in terms of ENOB and training time in the typical case are listed in Table III, and compared to a resistor based binary-weighted DAC.

Endurance is an essential performance criterion of memristive devices for memory applications. Therefore, qualitative and pessimistically approximate analysis is done to evaluate the DAC's lifetime versus the increasing training time as a result of the memristor's endurance degradation. Endurance failure behavior is observed in Hf-based RRAM and can be explained by different physical mechanisms that degrade its switching characteristics and high-to-low resistance ratio. Among these mechanisms is the oxidation induced interface reaction, a result of high voltage/current during SET. The endurance of the fitted Pt/HfO$_x$/Hf/TiN is ~8K cycles with 1.15 V for SET and −2.25 V for RESET. Decreasing operational voltages considerably improves the endurance while increasing the switching time of the device. According to the fitted parameters in Table I, the simulated switching time with ±V$_w$ is 75 µs instead of the reported 400 ns with 1.15 V for SET, and 1 ms instead of the reported 10 µs with −2.25 V for RESET. The trade-off between write latency and endurance has been well-studied, and the relationship between them is formalized as $$\text{Endurance} \approx \left(\frac{t_{WP}}{t_0}\right)^{Expo\_factor}, \quad (22)$$

where $t_{WP}$ is write latency, $t_0$ is a device related constant, and Expo_factor is an empirical constant with a typical value of 2. Accordingly, the endurance of the device will increase to $8 \cdot 10^7$ cycles with the proposed writing voltage.

Due to the nature of the proposed DAC, it will continue training until it equals $E_{threshold}$ and achieves a high ENOB. Thus, the high-to-low resistance ratio degradation is not discernible, as it is compensated for by longer training times. A rough approximation, using logarithmic endurance degradation in time, is modeled by a 10% drop of $\Delta R$ per decade, as listed in Table II. The training time as a function of the number of switching cycles is shown in FIG. 9D. To prove that the endurance is not a limitation for the proposed DAC, we estimate the number of training epochs until wear-out. As a pessimistic evaluation, we assume that every 1 ms of training time equals a full RESET. This assumption is more aggressive for degradation than a total of 200 intermediate switches in 1 ms. Therefore, the maximum training time is 160 ms and the corresponding minimal number of training epochs until wear-out is ≈

$$\frac{8 \cdot 10^7}{160} = 500 \text{ K}.$$

This finding implies that, in the worst case, the DAC could be reconfigured ~150 times per day for ~10 years either for new configuration or for calibration-only, depending on the running application.

The proposed DAC was simulated with different sampling frequencies $f_s$ to show its versatility and flexibility to adapt to different conditions that represent different specifications for different applications. At high frequency the memristor is modeled as a resistor in parallel to a capacitor and is connected in series with an inductance on each side. The parasitic capacitance between electrodes of the memristor is dominant at high frequencies. As a result, the equivalent impedance of the memristor decays along the frequency. The values of the parasitic capacitance and inductance are listed in Table I. The maximum frequency at which the DAC can operate, $f_{max}$, is defined as the frequency at which the high-to-low-impedance ratio will not allow binary-weighted distribution of N-bits that covers the half- to full-scale voltage range:

$$\left|\frac{Z_{OFF}}{Z_{ON}}\right| \leq 2^{N+1}, \quad (23)$$

where $Z_{OFF}$ and $Z_{ON}$ are high and low impedance states, respectively. At the frequency-band of interest, $$Z_{ON} \approx R_{ON}, Z_{OFF} \approx R_{OFF} \| \frac{1}{2\pi j f_s C_{mem}} = \frac{R_{OFF}}{1 + 2\pi j f_s C_{mem} R_{OFF}},$$

and the series inductance is negligible. By solving (22), we find $$f_{max} = \frac{1}{2\pi R_{OFF} C_{mem}} \cdot \sqrt{\left(\frac{R_{OFF}}{R_{ON} \cdot 2^{N+1}}\right)^2 - 1}. \quad (24)$$

Reference is now made to FIGS. 10A and 10B. FIG. 10A shows a high impedance state $Z_{OFF}$ as a function of sampling frequency; dashed lines indicate the maximum possible frequency bandwidth for a half- to full-scale voltage range with a high-to-low-impedance ratio of 32 and 16, respectively. FIG. 10B shows a DAC reconfiguration for a 10 MSPS sampling frequency, by continuous synaptic update. The frequency-dependent variations were captured by the synaptic weights.

The decay of $Z_{OFF}$ as a function of frequency is shown in FIG. 10A, along with the maximum frequency bandwidth for different-scale voltages. In our case, for a four-bit DAC and full- to half-scale voltage range, $f_{max}$=1.668 GHz, which is below the transit frequency $f_T$ of 0.18 µm CMOS transistors, the cutoff frequency of memristors, and the OpAmp slew rate.

The training dynamics are different in this case because the learning rate is a function of the pulse-width duration, which is a function of the sampling frequency. The higher the sampling frequency, the smaller the learning rate and the higher the number of training samples. Additionally, taking the frequency dependent variations into consideration, the synaptic weights are different and are able to absorb and compensate for these variations, as shown in FIG. 10B in response to the 10 MSPS sampling frequency. The frequency is 100× higher than 100 KSPS; as a result, the time interval for a single sample is 100× smaller, as is the learning rate. However, the total number of training samples until the error equals $E_{threshold}$ is ~1.5× greater, with ~66× smaller training time (~0.45 ms). The ratios are not linear because the convergence time is different among the bits and not linear. This property proves that the DAC is a general-purpose device with a generic standard methodology.

Expanding the DAC Design

Reference is now made to FIG. 11 which shows an eight-bit reconfigurable DAC composed from two four-bit DACs by using a two-layer neural network. As explained in the previous sections, a DAC is determined by its sampling frequencies and the number of resolution bits. These two specifications are challenging to achieve together in conventional DACs, and they are considered two major bottlenecks. We show an efficient mechanism that achieves optimal possible accuracy from the number of real allocated bits N for each sampling frequency $f_s$. Hereinabove, we formalized the constraints on the number of bits in (17) and (18). Using these constraints and the design parameters listed in Table I, the maximum number of bits was at most four. This section discusses large-scale DACs by using the proposed four-bit DAC as a prototype that can be duplicated or cascaded to create a larger architecture. Interestingly, AI techniques that involve deep neural networks and back-propagation algorithms can be exploited and interpolated into the design of large-scale DACs that are based on the four-bit DAC.

For example, in FIG. 11, an eight-bit DAC that is based on the four-bit DAC is shown. The analog output of such a DAC is $$\begin{cases} A_1 \approx -\sum_{i=0}^{3} \frac{R_f}{R_{mem_i}} V_i \\ A_2 \approx -\sum_{i=4}^{7} \frac{R_f}{R_{mem_i}} V_i \\ A_{tot} = W_{21} A_1 + W_{22} A_2 \end{cases} \quad (25)$$

where $W_{21}$, $W_{22}$ are the second-layer weights ($W_{2j}=R_f/R_{2j}^{j=1,2}$). Similarly to (5), the error function of the eight-bit deep neural network DAC is $$E = \frac{1}{2} \sum_{k=1}^{K} \left( A_{tot}^{(k)} - t^{(k)} \right)^2. \quad (26)$$

The learning rules of the first layer synapses $W_{1i(0 \le i \le 7)}$ are extracted by using the error gradient descent and backpropagation algorithms $$\Delta W_{1i(0 \le i \le 3)}^{(k)} = -\eta \frac{\partial E}{\partial W_{1i}^{(k)}} \quad (27)$$
$$= -\eta \frac{\partial E}{\partial A_{tot}^{(k)}} \cdot \frac{\partial A_{tot}^{(k)}}{\partial A_1^{(k)}} \cdot \frac{\partial A_1^{(k)}}{\partial W_{1i}^{(k)}}$$
$$= -\eta W_{21} \left( A_{tot}^{(k)} - t^{(k)} \right) V_i^{(k)},$$

$$\Delta W_{1i(4 \le i \le 7)}^{(k)} = -\eta \frac{\partial E}{\partial W_{1i}^{(k)}} \quad (28)$$
$$= -\eta \frac{\partial E}{\partial A_{tot}^{(k)}} \cdot \frac{\partial A_{tot}^{(k)}}{\partial A_2^{(k)}} \cdot \frac{\partial A_2^{(k)}}{\partial W_{1i}^{(k)}}$$
$$= -\eta W_{22} \left( A_{tot}^{(k)} - t^{(k)} \right) V_i^{(k)}.$$

Using the same design methodology as for the four-bit DAC, this network defines a high precision eight-bit DAC with adaptive abilities to self-calibrate mismatches and tolerate variations. The weights in the second layer are fixed and predefined during design time; they do not need to be adjustable, and they do not obey the learning rule. Thus, learning rules (27) and (28) depend on predefined parameters and do not vary during training as in multi-layer neural networks with a backpropagation algorithm. The training data-set is given through and compared to the DAC output, which is the second layer output, and then the error product is back-propagated directly to the first layer synapses for both four-bit DACs simultaneously. Different learning rates are used for each four-bit DAC. Although resistors are highly prone to manufacturing variations, they can be used effectively for the second layer since the mismatches in that layer will be calibrated and compensated for by the weights of the first layer. Thus, the proposed large-scale concept will actually take advantage of the defects and handle them robustly. Furthermore, considering adjustable weights in the second layer will necessarily increase the design complexity of the training mechanism: its implementation will involve specific circuitry with higher area and power consumption, which may lead to undesired oscillations and wasteful training time.

A major challenge that directly relates to large-scale trainable DACs is how to generate the data-set for teaching. We assume that peripheral circuitry is provided and able to generate real-time data-sets with different specifications that fit the required DAC. Larger numbers of bits, smaller full-scale voltages, and higher frequencies, however, will be challenging for these circuits, which are not only technology dependent but also special purpose. For example, pulse-width modulators are bounded by the frequency with they can work. Therefore, the proposed binary-weighted time-varying gradient descent complicates the design but improves accuracy, compared to the regular gradient descent that uses a uniform learning rate.

FIG. 12 illustrates flow of the online binary-weighted time-varying gradient descent training algorithm, which updates the weights according to the error function.

Thus according to the above description, a reconfigurable and self-calibrating binary-weighted DAC, based on artificial neural network, may be provided. The configuration consists of a machine learning or artificial intelligence algorithm that adjusts the synapses of the neural network to achieve a DAC. The equivalence between single-layer neural network and binary weighted DAC has been shown. A supervised learning algorithm termed the binary weighted gradient descent, which is based on online stochastic gradient descent, has been developed to train the network efficiently on-chip in real time to perform an adaptive high-precision 4-bit DAC.

A hybrid CMOS-memristor circuit implementation may be provided as described for the realization of the neural network. The learning algorithm successfully adjusts the memristors along with the full-scale voltage range, and calibrates the DAC to improve linearity of the DAC. With an output range of 1.8 V, the calibration process was shown to improve INL from −32 LSB to 0 LSB, and DNL from −13 LSB to 0 LSB. To our knowledge, this is the first neural-network based DAC.

The present embodiments may provide valuable results in data-driven converters achieving high-precision, high-speed, low-cost and low-power consumption for different applications. It is expected that during the life of a patent maturing from this application many relevant memristor and learning technologies will be developed and the scopes of the corresponding terms are intended to include all such new technologies a priori.

The terms "comprises", "comprising", "includes", "including", "having" and their conjugates mean "including but not limited to".

As used herein, the singular form "a", "an" and "the" include plural references unless the context clearly dictates otherwise.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. The present specification is to be read is if all such single embodiments and separate embodiments and subcombinations are explicitly set forth herein. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A digital to analog converter comprising:
inputs for receiving parallel digital bits of a digital input signal;
an output for outputting an analog signal; and
a neural network layer connected to said inputs to receive said digital bits of said digital input signal from said inputs and configured to convert said parallel digital bits of said digital input signal into an output analog signal representative of said digital input signal, the neural network layer further connected to provide said output analog signal to said output following said conversion by said neural network layer, the neural network comprising a plurality of adaptable synapses, each associated with a respective one of said inputs; and said output being connected to each of said plurality of adaptable synapses to receive a combined synapse signal from which to provide said output analog signal, wherein each synapse is set with a respective weight and said output analog signal is a weighted sum of said parallel bits of said digital input signal, each of said adaptable synapses comprising a memristor, said memristor being set with said respective weight, wherein said adaptable synapses have respective enablement inputs and wherein said respective weights are configurable via feedback upon enabling via said enablement inputs at each respective memristor, respective weights at said adaptable synapses being configurable via said feedback to minimize a discrete analog error measured in said output.

2. The device of claim 1, wherein said minimizing an error is carried out using successive iterations of a stochastic gradient descent.

3. The device of claim 2, wherein said stochastic gradient descent comprises iterations of $$\Delta W_i^{(k)} = -\eta \frac{\partial E}{\partial W_i^{(k)}} = -\eta \frac{\partial E}{\partial A^k} \cdot \frac{\partial A^{(k)}}{\partial W_i} = -\eta(A^{(k)} - t^{(k)})V_i^{(k)}$$

wherein $W_i^{(k)}$ are the respective weights for the $k^{th}$ sample, $\eta$ is a learning rate, A is actual output, t is measured output, E is mean square error and $V_i^{(k)}$ is a single empirical sample provided to the input at the $k^{th}$ iteration.

4. The device of claim 1, wherein said adaptable synapses respectively comprise a memristor connected to a common terminal of two MOSFET transistors of complementary type respectively, a synapse output comprising current flowing through the memristor.

5. The device of claim 4, wherein said two MOSFET transistors have respective gates and said enablement input comprises a connection to said respective gates.

6. The device of claim 1, wherein said minimizing an error is carried out using successive iterations of a binary weighted time-varying gradient descent learning rule.

7. The device of claim 6, wherein said rule is:

$$\Delta W_i^{(k)} = -\eta(t)(A^{(k)} - t^{(k)})V_i^{(k)}$$

wherein $\eta(t) =$ $\eta$ if $k <= K/2$ $\eta/2$ if $K/2 < k <= 3K/4$

...

$\eta/2^{N-1}$ if $(2^{N-1} - 1) \cdot K/2^{N-1} < k <= (2^N - 1) \cdot K/2^N$ $W_i^{(k)}$ are the respective weights for the $k^{th}$ sample,
A is actual output,
t is measured output, and
$V_i^{(k)}$ is a single empirical sample provided to the input at the $k^{th}$ iteration.

8. A method for carrying out digital to analog conversion comprising:
receiving parallel digital bits of a digital input signal;
using a neural network layer to convert said parallel digital bits of said digital input signal into an output analogue signal representative of said digital input signal, said converting comprising passing said parallel digital bits via respectively weighted synapses of said neural network layer to an output, thereby to provide said output analog signal representative of said digital input signal at said output;
setting said respective weights at individual synapses, wherein each of said individual synapses comprises a memristor and at least two enablement inputs;
enabling said enablement inputs and writing in said respective weightings using feedback from an error measured in said output;
adjusting said weightings to minimize said error; and
outputting said output analog signal.

9. The method of claim 8, wherein each of said weighted synapses comprises a memristor, the method comprising setting said memristors with said respective weight.

10. The method of claim 8, wherein said minimizing said error is carried out using successive iterations of a stochastic gradient descent.

11. The method of claim 10, wherein said stochastic gradient descent comprises iterations of $$\Delta W_i^{(k)} = -\eta \frac{\partial E}{\partial W_i^{(k)}} = -\eta \frac{\partial E}{\partial A^k} \cdot \frac{\partial A^{(k)}}{\partial W_i} = -\eta(A^{(k)} - t^{(k)})V_i^{(k)}$$

wherein $V_i^{(k)}$ are the respective weights for the $k^{th}$ sample, $\eta$ is a learning rate, A is actual output, t is measured output, E is mean square error and $V_i^{(k)}$ is a single empirical sample provided to the input at the $k^{th}$ iteration.

12. The method of claim 8, wherein said synapses respectively comprise a memristor connected to a common terminal of two MOSFET transistors of complementary type respectively, the method comprising using current flowing through said memristor as the synapse output.

13. The method of claim 8, wherein said setting said memristors with said respective weights comprises minimizing said error using successive iterations of a binary weighted time-varying gradient descent learning rule.

14. The method of claim 13, wherein said rule is:

$$\Delta W_i^{(k)} = -\eta(t)(A^{(k)} - t^{(k)})V_i^{(k)}$$

wherein $\eta(t) =$ $\eta$ if $k <= K/2$ $\eta/2$ if $K/2 < k <= 3K/4$

...

$\eta/2^{N-1}$ if $(2^{N-1}-1) \cdot K/2^{N-1} < k <= (2^N - 1) \cdot K/2^N$ $W_i^{(k)}$ are the respective weights for the $k^{th}$ sample,
A is actual output,
t is measured output, and
$V_i^{(k)}$ is a single empirical sample provided to the input at the $k^{th}$ iteration.

\* \* \* \* \*